United States Patent
Kodama

(10) Patent No.: US 6,733,951 B2
(45) Date of Patent: May 11, 2004

(54) POSITIVE RADIATION-SENSITIVE COMPOSITION

(75) Inventor: Kunihiko Kodama, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/144,536

(22) Filed: May 14, 2002

(65) Prior Publication Data

US 2003/0075708 A1 Apr. 24, 2003

(30) Foreign Application Priority Data

May 17, 2001 (JP) .................................... P.2001-148006

(51) Int. Cl.$^7$ ............................................. G03F 7/004
(52) U.S. Cl. ..................... 430/270.1; 430/921; 430/922
(58) Field of Search .............................. 430/270.1, 921, 430/922

(56) References Cited

U.S. PATENT DOCUMENTS 5,919,596 A * 7/1999 Hedrick et al. ........... 430/270.1
6,528,232 B1 * 3/2003 Maeda et al. ............. 430/270.1

FOREIGN PATENT DOCUMENTS

JP       2000-292917       10/2000

OTHER PUBLICATIONS

Kodama et al., US 2003/0017415 A1, Jan. 2003.*
Hatakeyama et al., US 2002/0098443 A1, Jul. 2002.*

* cited by examiner

Primary Examiner—Rosemary Ashton
(74) Attorney, Agent, or Firm—Sughrue Mion, PLLC

(57) ABSTRACT

A positive radiation-sensitive composition comprising:
(A) at least one compound capable of generating an acid upon irradiation with an actinic ray represented by the following formula (I); and
(B) a resin having a group capable of decomposing by the action of an acid to increase the solubility in an alkali developing solution:

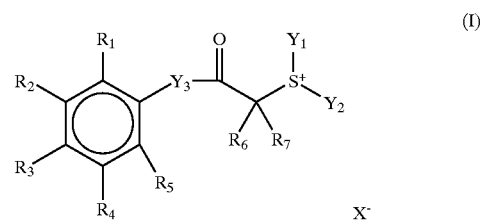

wherein $R_1$, $R_2$, $R_3$, $R_4$ and $R_5$ each represents a hydrogen atom, an alkyl group, an alkoxyl group, a nitro group, a halogen atom, an alkyloxycarbonyl group, or an aryl group, and at least two of $R_1$, $R_2$, $R_3$, $R_4$ and $R_5$ may be bonded to form a cyclic structure; $R_6$ and $R_7$ each represents a hydrogen atom, an alkyl group, a cyano group or an aryl group; $Y_1$ and $Y_2$ each represents an alkyl group, an aryl group, an aralkyl group, or an aromatic group containing a hetero atom, and $Y_1$ and $Y_2$ may be bonded to form a ring; $Y_3$ represents a single bond or a divalent linking group; and $X^-$ represents a non-nucleophilic anion; provided that at least one of $R_1$, $R_2$, $R_3$, $R_4$ and $R_5$, and at least one of $Y_1$ and $Y_2$ are bonded to form a ring, or at least one of $R_1$, $R_2$, $R_3$, $R_4$ and $R_5$, and at least one of $R_6$ and $R_7$ are bonded to form a ring; and there may be present two or more structures represented by formula (I) by being bonded at any position of $R_1$ to $R_7$ or at any poison of $Y_1$ and $Y_2$ via a linking group.

19 Claims, No Drawings

POSITIVE RADIATION-SENSITIVE COMPOSITION

FIELD OF THE INVENTION

The present invention relates to a positive radiation-sensitive composition for use in the manufacturing processes of lithographic printing plates and semiconductors such as IC, the manufacture of circuit boards for liquid crystals and thermal heads, and other photofabrication processes.

BACKGROUND OF THE INVENTION

A variety of kinds of compositions are used as the photosensitive compositions for use in the manufacturing processes of lithographic printing plates and semiconductors such as IC, the manufacture of circuit boards for liquid crystals and thermal heads, and other photofabrication processes, and photoresist photosensitive compositions are generally used. The photoresist photosensitive compositions are roughly classified into two kinds of a positive type and a negative type.

As one of positive photoresist photosensitive compositions, chemically amplified resist compositions are disclosed in U.S. Pat. No. 4,491,628 and EP 249139.

Chemically amplified positive resist compositions are pattern-forming materials for forming patterns on a substrate by generating an acid on the exposed area by irradiation with radiations such as far ultraviolet rays and, by the reaction with the acid as a catalyst, transforming the solubilities in a developing solution of the irradiated area and the non-irradiated area with radiation.

As such examples, the combinations of compounds which generate an acid by photodecomposition with acetal or O,N-acetal compounds (e.g., JP-A-48-89003 (the term "JP-A" as used herein means an "unexamined published Japanese patent application")), with ortho esters or an amide acetal compounds (e.g., JP-A-51-120714), with polymers having an acetal or ketal group at the main chain (e.g., JP-A-53-133429), with enol ether compounds (e.g., JP-A-55-12995), with N-acyliminocarbonic acid compounds (e.g., JP-A-55-126236), with polymers having an ortho ester group at the main chain (e.g., JP-A-56-17345), with tertiary alkyl ester compounds (e.g., JP-A-60-3625), with silyl ester compounds (e.g., JP-A-60-10247), and with silyl ether compounds (e.g., JP-A-60-37549 and JP-A-60-121446) can be exemplified. These combinations show high photosensitivity as quantum yields thereof exceed 1 in principle.

Similarly, as systems which are decomposed by heating in the presence of an acid and alkali-solubilized although stable during aging under room temperature, e.g., the combinations of compounds which generate an acid by exposure (e.g., those disclosed in JP-A-59-45439, JP-A-60-3625, JP-A-62-229242, JP-A-63-27829, JP-A-63-36240, JP-A-63-250642, *Polym. Eng. Sce.*, Vol. 23, p. 1012 (1983), *ACS. Sym.*, Vol. 242, p. 11 (1984), *Semiconductor World*, p. 91 (November, 1987), *Macromolecules*, Vol. 21, p. 1475 (1988), and *SPIE*, Vol. 920, p. 42 (1988)), with esters or carbonic ester compounds of tertiary or secondary carbons (e.g., t-butyl, 2-cyclohexenyl) can be exemplified. These systems also show high sensitivity and small absorption in far ultraviolet region, therefore, they are effective for shifting the wavelength of light sources to shortwave where it is possible to perform ultra-fine process.

These chemically amplified positive resists can be roughly classified into three-component series comprising an alkali-soluble resin, a compound generating an acid upon irradiation with radiation (a light-acid generating agent (i.e., a photo-acid generating agent)), and a dissolution-inhibiting compound of an alkali- soluble compound having an acid-decomposable group, and two-component series comprising a resin having a group decomposable upon reaction with an acid and becoming alkali-soluble, and a light-acid generating agent. In these two-component or three-component series chemically amplified positive resists, a resist pattern is obtained by development after heating process via an acid from a light-acid generating agent by exposure.

As described above, these chemically amplified positive resists are effective for shifting the wavelength of light sources to shortwave where it is possible to perform ultra-fine process, and further improvement of resolution has been required.

As the light-acid generating agents, a triarylsulfonium salt, a phenacylsulfonium salt and an iodonium salt are well known.

A resist composition containing an acid-decomposable polymer and a mixed acid-generating agent comprising a triphenyl-sulfonium salt and a phenacylsulfonium salt is disclosed in JP-A-2000-292917. A triarylsulfonium salt is an excellent light-acid generating agent but it is large in absorption, and so when a large amount is added for improving sensitivity, the light transmittance of the resist film lowers, and results in profile called taper. On the other hand, a phenacylsulfonium salt is relatively small in absorption but light-acid generating performance is low, therefore, when a phenacylsulfonium salt is used, the sensitivity of the resist lowers.

SUMMARY OF THE INVENTION

Accordingly, an object of the present invention is to provide a positive radiation-sensitive composition which shows high sensitivity and high resolution in pattern formation by irradiation with an actinic ray.

As a result of eager investigation, the present inventors found that the above object could be achieved by the use of a compound having a specific structure as the compound capable of generating an acid upon irradiation with an actinic ray, which led to the present invention.

(1) A positive radiation-sensitive composition comprising:

(A) at least one compound capable of generating an acid upon irradiation with an actinic ray represented by the following formula (I); and (B) a resin having a group capable of decomposing by the action of an acid to increase the solubility in an alkali developing solution:

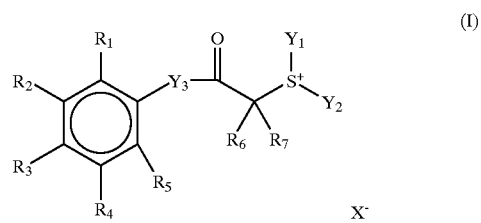

wherein $R_1$, $R_2$, $R_3$, $R_4$ and $R_5$ each represents a hydrogen atom, an alkyl group, an alkoxyl group, a nitro group, a halogen atom, an alkyloxycarbonyl group, or an aryl group, and at least two of $R_1$, $R_2$, $R_3$, $R_4$ and $R_5$ may be bonded to form a cyclic structure; $R_6$ and $R_7$ each represents a hydrogen atom, an alkyl group, a cyano group or an aryl group; $Y_1$ and $Y_2$ each represents an alkyl group, an aryl group, an aralkyl group, or an aromatic group containing a heteroatom, and $Y_1$ and $Y_2$ may be bonded to form a ring; $Y_3$ represents a single bond or a divalent linking group; and $X^-$ represents a non-nucleophilic anion; provided that at least one of $R_1$, $R_2$, $R_3$, $R_4$ and $R_5$, and at least one of $Y_1$ and $Y_2$ are bonded to form a ring, or at least one of $R_1$, $R_2$, $R_3$, $R_4$ and $R_5$, and at least one of $R_6$ and $R_7$ are bonded to form a ring; and there may be present two or more structures represented by formula (I) by being bonded at any position of $R_1$ to $R_7$ or at any position of $Y_1$ and $Y_2$ via a linking group.

(2) The positive radiation-sensitive composition as described in the above item (1), wherein the compound (A) is represented by the following formula (IA) or (IB):

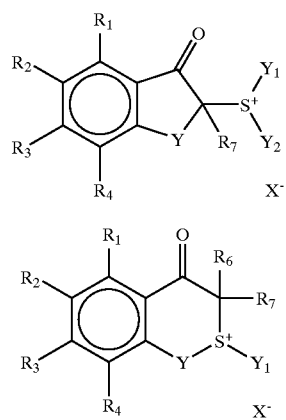

wherein in formula (IA), $R_1$ to $R_4$, $R_7$, $Y_1$, $Y_2$ and $X^-$ have the same meaning as those in formula (I), and Y represents a single bond or a divalent linking group; and in formula (IB), $R_1$ to $R_4$, $R_6$, $R_7$, $Y_1$ and $X^-$ have the same meaning as those in formula (I), and Y represents a single bond or a divalent linking group.

(3) The positive radiation-sensitive composition as described in the above item (1) or (2), which further comprises (C) a low molecular weight dissolution-inhibiting compound: having a molecular weight of 3,000 or less; containing an acid-decomposable group; and capable of increasing the solubility in an alkali developing solution by the action of an acid.

(4) A positive radiation-sensitive composition comprising:

(A) at least one compound capable of generating an acid upon irradiation with an actinic ray represented by the following formula (I);

(C) a low molecular weight dissolution-inhibiting compound: having a molecular weight of 3,000 or less; containing an acid-decomposable group; and capable of increasing the solubility in an alkali developing solution by the action of an acid; and (D) a resin insoluble in water and soluble in an alkali developing solution:

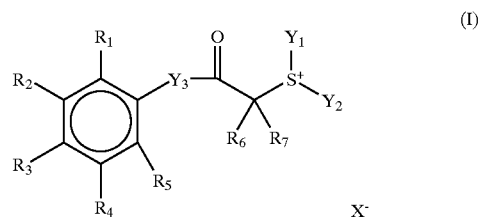

wherein $R_1$, $R_2$, $R_3$, $R_4$ and $R_5$ each represents a hydrogen atom, an alkyl group, an alkoxyl group, a nitro group, a halogen atom, an alkyloxycarbonyl group, or an aryl group, and at least two of $R_1$, $R_2$, $R_3$, $R_4$ and $R_5$ may be bonded to form a cyclic structure; $R_6$ and $R_7$ each represents a hydrogen atom, an alkyl group, a cyano group or an aryl group; $Y_1$ and $Y_2$ each represents an alkyl group, an aryl group, an aralkyl group, or an aromatic group containing a hetero atom, and $Y_1$ and $Y_2$ may be bonded to form a ring; $Y_3$ represents a single bond or a divalent linking group; and $X^-$ represents a non-nucleophilic anion; provided that at least one of $R_1$, $R_2$, $R_3$, $R_4$ and $R_5$, and at least one of $Y_1$ and $Y_2$ are bonded to form a ring, or at least one of $R_1$, $R_2$, $R_3$, $R_4$ and $R_5$, and at least one of $R_6$ and $R_7$ are bonded to form a ring; and there may be present two or more structures represented by formula (I) by being bonded at any position of $R_1$ to $R_7$ or at any position of $Y_1$ and $Y_2$ via a linking group.

In the present invention, even when electron beams are used as the energy ray for irradiation, an excellent performance can be shown. When electron beams are used for irradiation, since the incident electron has electric charge and interacts with the atomic nuclei and the electrons of the materials constituting a resist, scattering invariably occurs when electron beam comes into the resist film, as a result, pattern profile is deteriorated.

Further, there is another problem that an irradiation area widens due to this scattering even if irradiation is performed by diaphragming the beam diameter for resolving a minute pattern and resolution is deteriorated.

The composition in the present invention successfully solved these problems attributable to electron beams.

DETAILED DESCRIPTION OF THE INVENTION

The present invention includes:
1. A positive radiation-sensitive composition containing the following components as the essential components (hereinafter also referred to as "first composition"):
   (A) at least one compound capable of generating an acid upon irradiation with an actinic ray represented by formula (I), and
   (B) a resin having a group capable of decomposing by the action of an acid to increase the solubility in an alkali developing solution;
2. A positive radiation-sensitive composition containing the following components as the essential components (hereinafter also referred to as "second composition"):
   (A) at least one compound capable of generating an acid upon irradiation with an actinic ray represented by formula (I),
   (C) a compound having a molecular weight of 3,000 or less which is capable of decomposing by the action of an acid to increase the solubility in an alkali developing solution, and (D) a resin insoluble in water and soluble in an alkali developing solution (hereinafter sometimes merely referred to as an alkali-soluble resin).

Hereafter, the description of mere positive radiation-sensitive composition or composition include both first and second compositions.

Further, in the present invention, actinic rays mean far ultraviolet rays (a KrF excimer laser, an ArF excimer laser), an electron beam, an X-ray and an ion line.

In the first place, the components contained in these positive radiation-sensitive compositions, such as compounds and resins, are described in detail.

Explanation of Each Component Contained in Composition

[1] (A) Compound Capable of Generating an Acid Upon Irradiation with an Actinic Ray Represented by Formula (I) (Hereinafter Merely Referred to as Component (A) or an Acid-Generating Agent)

The acid-generating agent for use in the present invention is a compound capable of generating an acid upon irradiation with an actinic ray or a radiation represented by formula (I), more preferably represented by formula (IA) or (IB).

In formula (I), $R_1$, $R_2$, $R_3$, $R_4$ and $R_5$ each represents a hydrogen atom, an alkyl group, an alkoxyl group, a nitro group, a halogen atom, an alkyloxycarbonyl group, or an aryl group, and at least two of $R_1$, $R_2$, $R_3$, $R_4$ and $R_5$ may be bonded to form a cyclic structure; $R_6$ and $R_7$ each represents a hydrogen atom, an alkyl group, a cyano group or an aryl group; $Y_1$ and $Y_2$ each represents an alkyl group, an aryl group, an aralkyl group, or an aromatic group containing a hetero atom, and $Y_1$ and $Y_2$ may be bonded to form a ring; $Y_3$ represents a single bond or a divalent linking group; and $X^-$ represents a non-nucleophilic anion; provided that at least one of $R_1$, $R_2$, $R_3$, $R_4$ and $R_5$, and at least one of $Y_1$ and $Y_2$ are bonded to form a ring, or at least one of $R_1$, $R_2$, $R_3$, $R_4$ and $R_5$, and at least one of $R_6$ and $R_7$ are bonded to form a ring; and there may be present two or more structures represented by formula (I) by being bonded at any position of $R_1$ to $R_7$ or at any position of $Y_1$ and $Y_2$ via a linking group.

The alkyl group represented by each of $R_1$ to $R_7$ is a substituted or unsubstituted alkyl group, preferably an alkyl group having from 1 to 5 carbon atoms, and the examples of the unsubstituted alkyl groups include, e.g., a methyl group, an ethyl group, a propyl group, an n-butyl group, a sec-butyl group, and a t-butyl group.

The alkoxyl group, and the alkoxyl group in the alkyloxycarbonyl group represented by each of $R_1$ to $R_5$ is a substituted or unsubstituted alkoxyl group, preferably an alkoxyl group having from 1 to 5 carbon atoms, and the examples of the unsubstituted alkoxyl groups include, e.g., a methoxy group, an ethoxy group, a propoxy group, and a butoxy group.

The aryl group represented by each of $R_1$ to $R_7$, $Y_1$ and $Y_2$ is a substituted or unsubstituted aryl group, preferably an aryl group having from 6 to 14 carbon atoms, and the examples of the unsubstituted aryl groups include, e.g., a phenyl group, a tolyl group, and a naphthyl group.

The examples of the halogen atoms represented by $R_1$ to $R_5$ include, e.g., a fluorine atom, a chlorine atom, a bromine atom and an iodine atom.

The alkyl group represented by each of $Y_1$ and $Y_2$ is a substituted or unsubstituted alkyl group, preferably an alkyl group having from 1 to 30 carbon atoms, and the examples of the unsubstituted alkyl groups include a straight chain or branched alkyl group, e.g., a methyl group, an ethyl group, a propyl group, an n-butyl group, a sec-butyl group, and a t-butyl group, and a cyclic alkyl group, e.g., a cyclopropyl group, a cyclopentyl group, a cyclohexyl group, an adamantyl group, a norbornyl group and a boronyl group.

The aralkyl group represented by each of $Y_1$ and $Y_2$ is a substituted or unsubstituted aralkyl group, preferably an aralkyl group having from 7 to 12 carbon atoms, and the examples of the unsubstituted aralkyl groups include, e.g., a benzyl group, a phenethyl group and a cumyl group.

The aromatic group containing a hetero atom is, e.g., an aromatic group having from 4 to 14 carbon atoms, such as an aryl group, having a hetero atom, e.g., a nitrogen atom, an oxygen atom or a sulfur atom.

The aromatic group containing a hetero atom represented by $Y_1$ and $Y_2$ is a substituted or unsubstituted aromatic group containing a hetero atom, and the examples of the unsubstituted aromatic groups include a heterocyclic aromatic hydrocarbon group, e.g., furan, thiophene, pyrrole, pyridine and indole.

$Y_1$ and $Y_2$ may be bonded to form a ring together with $S^+$ in formula (I).

In this case, as the groups formed by the bonding of $Y_1$ and $Y_2$, e.g., an alkylene group having from 4 to 10 carbon atoms, preferably a butylene group, a pentylene group and a hexylene group, and particularly preferably a butylene group and a pentylene group can be exemplified.

The ring formed by the bonding of $Y_1$ and $Y_2$ together with $S^+$ in formula (I) may contain a hetero atom.

Each of the above alkyl, alkoxyl, alkoxycarbonyl, aryl, and aralkyl groups may be substituted with, e.g., a nitro group, a halogen atom, a carboxyl group, a hydroxyl group, an amino group, a cyano group, or an alkoxyl group (preferably having from 1 to 5 carbon atoms). The aryl and aralkyl groups may further be substituted with an alkyl group (preferably having from 1 to 5 carbon atoms).

As the substituent of the alkyl group, a halogen atom is preferred.

$Y_3$ represents a single bond or a divalent linking group. As the divalent linking group, e.g., a substituted or unsubstituted alkylene group, an alkenylene group, —O—, —S—, —CO—, —CONR— (wherein R represents a hydrogen atom, an alkyl group or an acyl group), and a linking group consisting of two or more of the above groups are preferably used.

As the non-nucleophilic anion represented by $X^-$, e.g., a sulfonate anion and a carboxylate anion can be exemplified.

The non-nucleophilic anion is an anion which is extremely poor in performance of causing a nucleophilic reaction, and this anion can inhibit aging decomposition by intramolecular nucleation reaction, and so the aging stability of a resist is improved.

As sulfonate anion, e.g., an alkylsulfonate anion, an arylsulfonate anion, and a camphorsulfonate anion can be exemplified.

As carboxylate anion, e.g., an alkylcarboxylate anion, an arylcarboxylate anion, and an aralkylcarboxylate anion can be exemplified.

As the alkyl group in the alkylsulfonate anion, an alkyl group having from 1 to 30 carbon atoms is preferably used, e.g., a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a boronyl group can be exemplified.

As the aryl group in the arylsulfonate anion, an aryl group having from 6 to 14 carbon atoms is preferably used, e.g., a phenyl group, a tolyl group and a naphthyl group can be exemplified.

The alkyl group and the aryl group in the alkylsulfonate anion and the arylsulfonate anion each may have a substituent.

As the substituents, e.g., a halogen atom, an alkyl group, an alkoxyl group, and an alkythio group can be exemplified.

As the halogen atom, e.g., a chlorine atom, a bromine atom, a fluorine atom and an iodine atom can be exemplified.

As the alkyl group, an alkyl group having from 1 to 15 carbon atoms is preferably used, e.g., a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, a undecyl group, a dodecyl group, a tridecyl group, a tetradecyl group, a pentadecyl group, a hexadecyl group, a heptadecyl group, an octadecyl group, a nonadecyl group, and an eicosyl group can be exemplified.

As the alkoxyl group, an alkoxyl group having from 1 to 5 carbon atoms is preferably used, e.g., a methoxy group, an ethoxy group, a propoxy group and a butoxy group can be exemplified.

As the alkylthio group, an alkylthio group having from 1 to 15 carbon atoms is preferably used, e.g., a methylthio group, an ethylthio group, a propylthio group, an isopropylthio group, an n-butylthio group, an isobutylthio group, a sec-butylthio group, a pentylthio group, a neopentylthio group, a hexylthio group, a heptylthio group, an octylthio group, a nonylthio group, a decylthio group, a undecylthio group, a dodecylthio group, a tridecylthio group, a tetradecylthio group, a pentadecylthio group, a hexadecylthio group, a heptadecylthio group, an octadecylthio group, a nonadecylthio group, and an eicosylthio group can be exemplified. The alkyl, alkoxyl and alkylthio groups may further be substituted with a halogen atom (preferably a fluorine atom).

As the alkyl group in the alkylcarboxylate anion, the same group as the alkyl group in the alkylsulfonate anion can be exemplified.

As the aryl group in the arylcarboxylate anion, the same group as the aryl group in the arylsulfonate anion can be exemplified.

As the aralkyl group in the aralkylcarboxylate anion, an aralkyl group having from 6 to 12 carbon atoms is preferably used, e.g., a benzyl group, a phenethyl group, a naphthylmethyl group and a naphthylethyl group can be exemplified.

The alkyl, aryl and aralkyl groups in the alkylcarboxylate anion, the arylcarboxylate anion, and the aralkylcarboxylate anion may have a substituent. As the substituents, e.g., the same halogen atom, the alkyl, alkoxyl and alkylthio groups as in the arylsulfonate anion can be exemplified.

As other non-nucleophilic anions, e.g., fluorinated phosphorus, fluorinated boron, and fluorinated antimony can be exemplified.

In formula (I), at least one of $R_1$, $R_2$, $R_3$, $R_4$ and $R_5$, and at least one of $Y_1$ and $Y_2$ are bonded to form a ring, or at least one of $R_1$, $R_2$, $R_3$, $R_4$ and $R_5$, and at least one of $R_6$ and $R_7$ are bonded to form a ring.

The steric structure of the compound represented by formula (I) is fixed by forming a ring and the photodecomposing property is improved.

There may be present two or more structures represented by formula (I) by being bonded at any position of $R_1$ to $R_7$ or at any position of $Y_1$ and $Y_2$ via a linking group.

The compound represented by formula (I) is preferably represented by formula (IA) or (IB).

In formula (IA), $R_1$ to $R_4$, $R_7$, $Y_1$, $Y_2$ and $X^-$ have the same meaning as those in formula (I), and Y represents a single bond or a divalent linking group.

In formula (IB), $R_1$ to $R_4$, $R_6$, $R_7$, $Y_1$ and $X^-$ have the same meaning as those in formula (I), and Y represents a single bond or a divalent linking group.

Y represents a single bond or a divalent linking group. As the divalent linking group, e.g., a substituted or unsubstituted alkylene group, an alkenylene group, —O—, —S—, —CO—, —CONR— (wherein R represents a hydrogen atom, an alkyl group or an acyl group), and a linking group consisting of two or more of the above groups are preferably used.

In formula (IA), Y preferably represents an alkylene group, an alkylene group containing an oxygen atom, or an alkylene group containing a sulfur atom, specifically a methylene group, an ethylene group, a propylene group, —CH$_2$—O— and —CH$_2$—S— are preferred, and a linking group forming a 6-membered ring, e.g., an ethylene group, —CH$_2$—O— and —CH$_2$—S— are most preferred. By forming a 6-membered ring, carbonyl plane and C—S$^+$ sigma bond become near vertical, and photodecomposing property is improved by orbital interaction.

The specific examples of the compounds represented by formula (I) are shown below, however, these examples should not be construed as limiting the scope of the present invention.

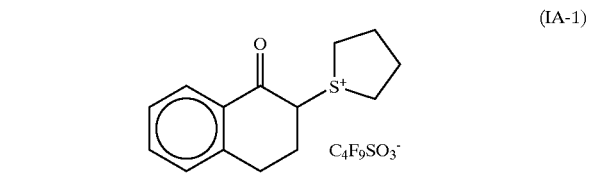

(IA-1)

(IA-2)

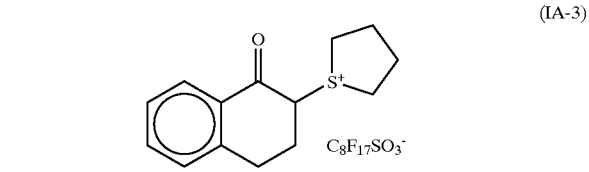

(IA-3)

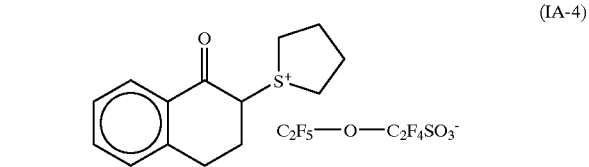

(IA-4)

(IA-5)

-continued
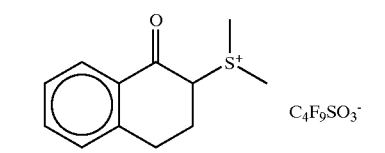 (IA-6)
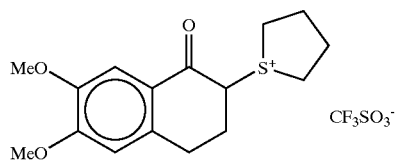 (IA-7)
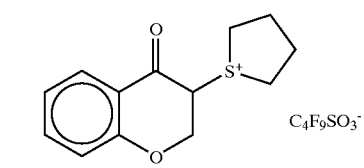 (IA-8)
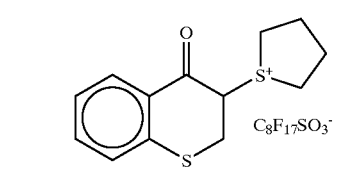 (IA-9)
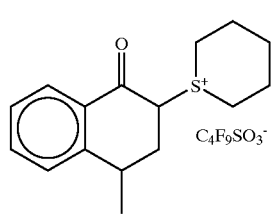 (IA-10)
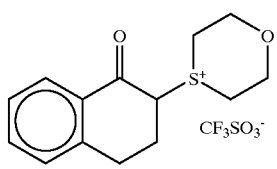 (IA-11)
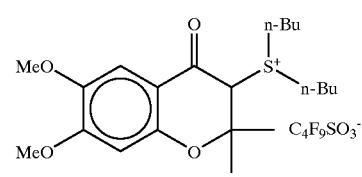 (IA-12)
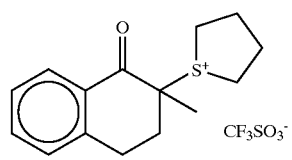 (IA-13)
-continued
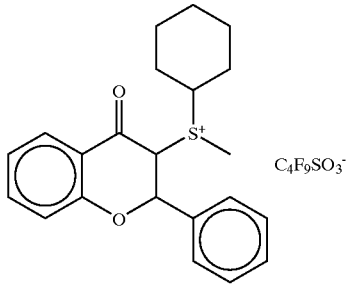 (IA-14)
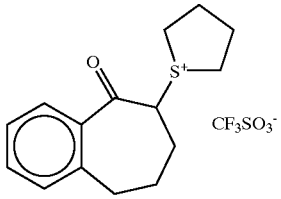 (IA-15)
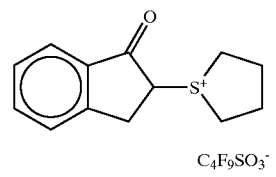 (IA-16)
(IA-17)
(IA-18)
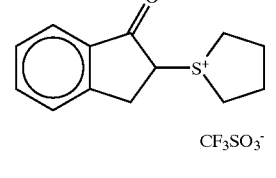 (IA-19)
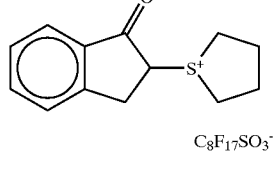 (IA-20)
(IA-21)

-continued
(IA-22)
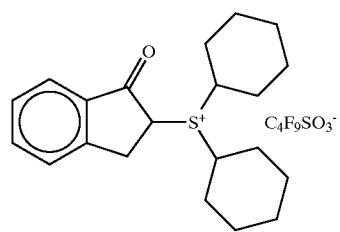
C₄F₉SO₃⁻
(IA-23)
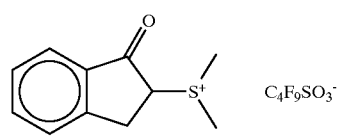
C₄F₉SO₃⁻
(IA-24)
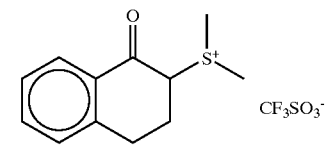
CF₃SO₃⁻
(IA-25)
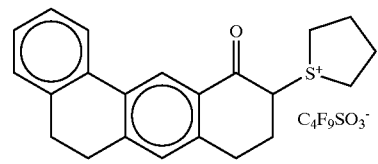
C₄F₉SO₃⁻
(IA-26)
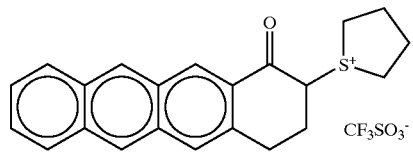
CF₃SO₃⁻
(IA-27)
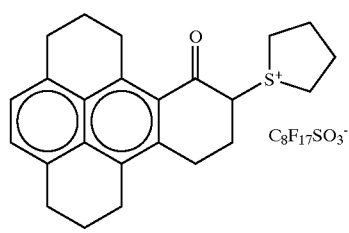
C₈F₁₇SO₃⁻
(IA-28)
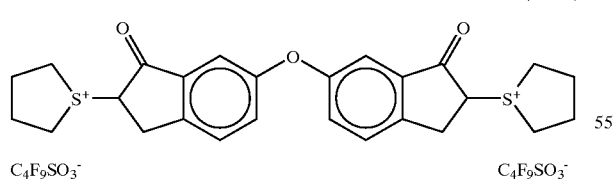
C₄F₉SO₃⁻          C₄F₉SO₃⁻
(IA-29)
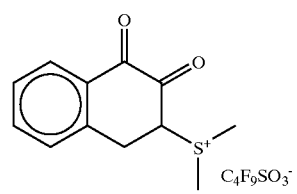
C₄F₉SO₃⁻
-continued
(IA-30)
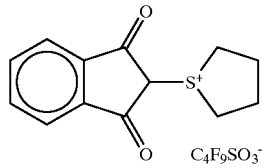
C₄F₉SO₃⁻
(IA-31)
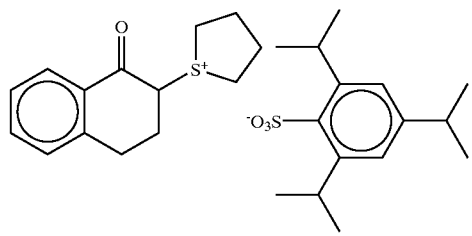
(IA-32)
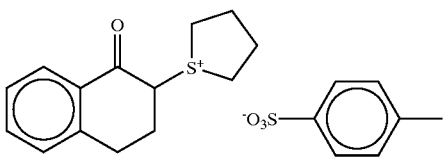
(IA-33)
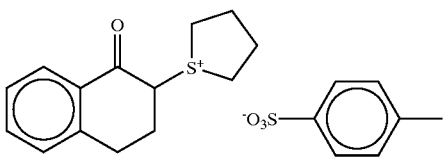
(IA-34)
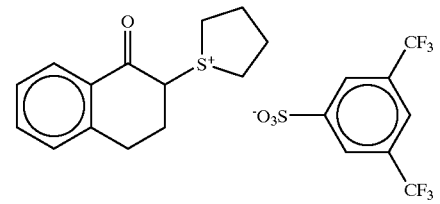
(IA-35)
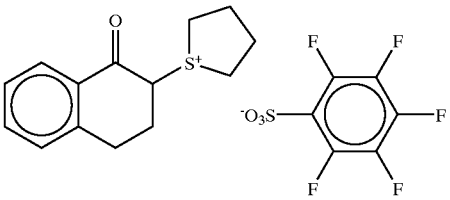
CH₃COO⁻
(IA-36)
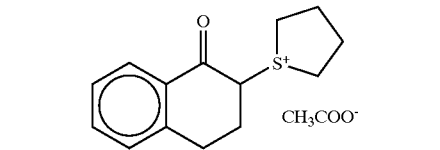
n-C₁₂H₂₅SO₃⁻
(IA-37)
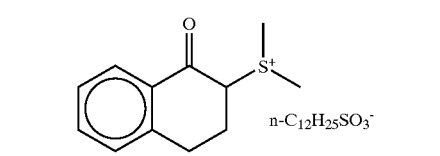

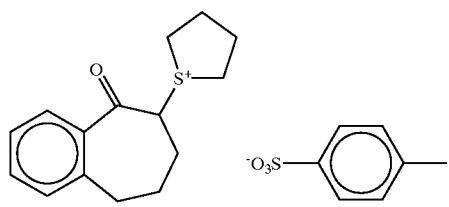
(IA-38)
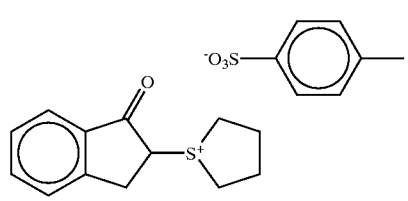
(IA-39)
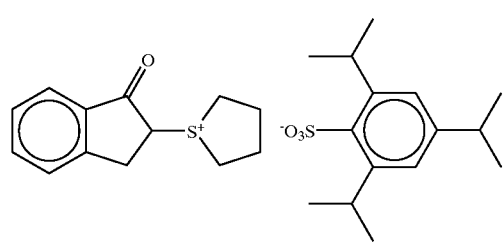
(IA-40)
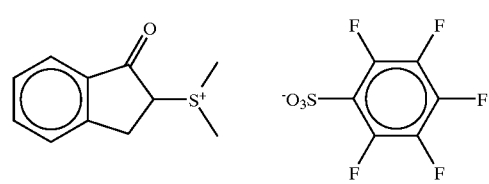
(IA-41)
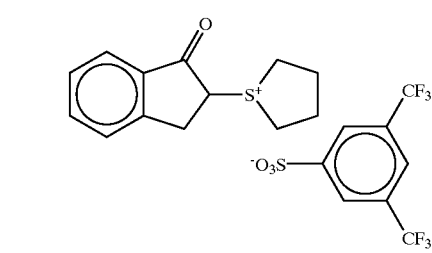
(IA-42)
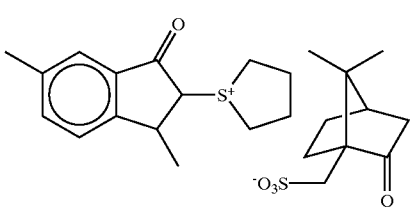
(IA-43)
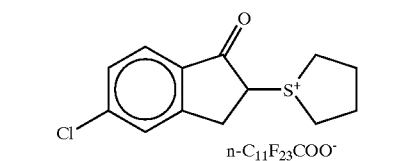
(IA-44)
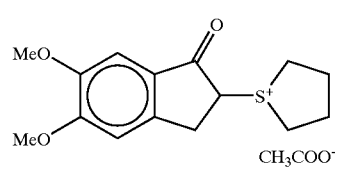
(IA-45)
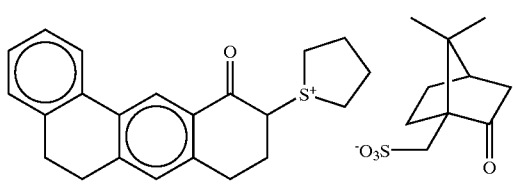
(IA-46)
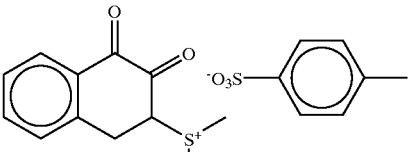
(IA-47)
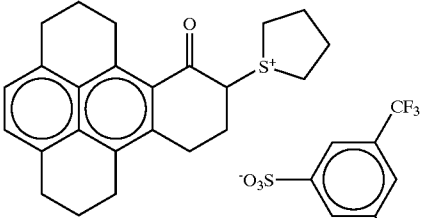
(IA-48)
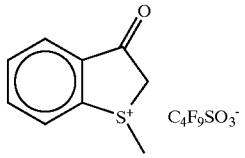
(IB-1)
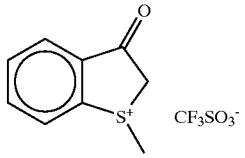
(IB-2)
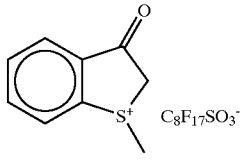
(IB-3)
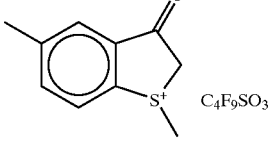
(IB-4)
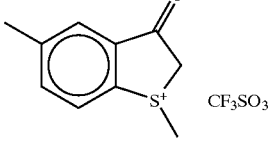
(IB-5)

-continued
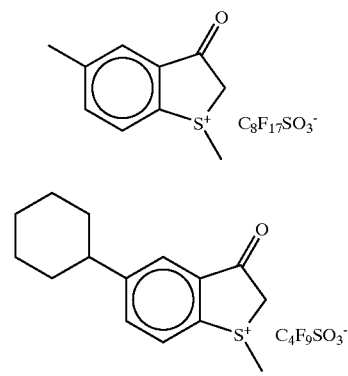

-continued (IB-22)

(IB-23)

(IB-24)

The compound represented by formula (I) can be used alone or in combination of two or more.

The compound represented by formula (IA) can be obtained by a method of reacting the corresponding α-halocyclic ketone and sulfide compound, or a method of converting the corresponding cyclic ketone to silyl enol ether, and then reacting with sulfoxide. The compound represented by formula (IB) can be obtained by reacting arylalkyl sulfide and α- or β-halogenated halide.

The content of the compound of component (A) in the positive photosensitive composition according to the present invention is preferably from 0.1 to 20 wt %, more preferably from 0.5 to 10 wt %, and still more preferably from 1 to 7 wt %, based on the solid content in the composition.

Acid Generating Agents Usable in Combination Besides Component (A)

A compound which decomposes and generates an acid upon irradiation with an actinic ray or a radiation can be used in the present invention besides component (A).

The use amount of a light-acid generating agent capable of being used in combination with component (A) of the present invention is, in molar ratio of (component (A))/(other acid generating agent), generally from 100/0 to 20/80, preferably from 100/0 to 40/60, and more preferably from 100/0 to 50/50.

As such light-acid generating agents which can be used in combination, a photoinitiator of photocationic polymerization, a photoinitiator of photoradical polymerization, a photodecoloring agent for dyes, a photodiscoloring agent, well-known compounds used for a microresist or the like which generate an acid upon irradiation with an actinic ray or a radiation, and mixtures of these compounds can be arbitrarily selected.

As such compounds, for example, onium salts, e.g., a diazonium salt, an ammonium salt, a phosphonium salt, an iodonium salt, a sulfonium salt, a selenonium salt, and an arsonium salt, an organic halogen compound, an organic metal/an organic halide, a light-acid generating agent having an o-nitrobenzyl type protective group, a compound which generates a sulfonic acid by photodecomposition represented by iminosulfonate, and a disulfone compound can be exemplified.

Further, compounds having introduced these groups or compounds capable of generating an acid upon irradiation with an actinic ray or a radiation into the main chain or side chain of the polymer can be used in the present invention, e.g., those disclosed in U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Further, the compounds which generate an acid by light as described, e.g., in U.S. Pat. No. 3,779,778 and EP No. 126712 can also be used in the present invention.

Of the above compounds which decompose upon irradiation with an actinic ray or a radiation and generate an acid usable in combination with component (A), those particularly effectively used in the present invention are described below.

(1) An Oxazole Derivative Represented by the Following Formula (PAG1) and an S-triazine Derivative Represented by the Following Formula (PAG2), which are Substituted with a Trihalomethyl Group (PAG1)

(PAG2)

wherein $R^{201}$ represents a substituted or unsubstituted aryl group or a substituted or unsubstituted alkenyl group; $R^{202}$ represents a substituted or unsubstituted aryl group, a substituted or unsubstituted alkenyl group, a substituted or unsubstituted alkyl group, or $-C(Y)_3$; and Y represents a chlorine atom or a bromine atom.

The specific examples thereof include the following compounds, however, these compounds should not be construed as limiting the scope of the present invention.

(PAG1-1)

(PAG1-2)

(PAG2-1)

(PAG2-2)

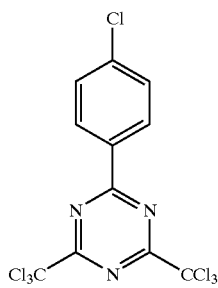

(2) An Iodonium Salt Represented by the Following Formula (PAG3) or a Sulfonium Salt Represented by the Following Formula (PAG4)

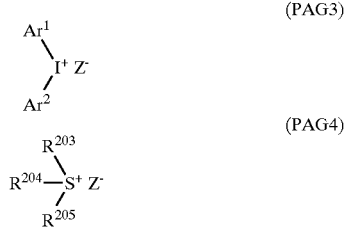

In formula (PAG3), $Ar^1$ and $Ar^2$ each represents a substituted or unsubstituted aryl group. The examples of the preferred substituents include an alkyl group, a haloalkyl group, a cycloalkyl group, an aryl group, an alkoxyl group, a nitro group, a carboxyl group, an alkoxycarbonyl group, a hydroxyl group, a mercapto group and a halogen atom.

In formula (PAG4), $R^{203}$, $R^{204}$ and $R^{205}$ each represents a substituted or unsubstituted alkyl group or a substituted or unsubstituted aryl group, preferably an aryl group having from 6 to 14 carbon atoms, an alkyl group having from 1 to 8 carbon atoms, or substituted derivatives thereof.

The substituent of the aryl group is preferably an alkoxyl group having from 1 to 8 carbon atoms, an alkyl group having from 1 to 8 carbon atoms, a nitro group, a carboxyl group, a hydroxyl group or a halogen atom, and the substituent of the alkyl group is preferably an alkoxyl group having from 1 to 8 carbon atoms, a carboxyl group, or an alkoxycarbonyl group.

In formulae (PAG3) and (PAG4), $Z^-$ represents a counter anion, e.g., $BF_4^-$, $AsF_6^-$, $PF_6^-$, $SbF_6^-$, $SiF_6^{2-}$, $ClO_4^-$, a perfluoroalkanesulfonate anion such as $CF_3SO_3^-$, a pentafluoro-benzenesulfonate anion, a condensed polynuclear aromatic sulfonate anion such as a naphthalene-1-sulfonate anion, an anthraquinonesulfonate anion, or a sulfonic acid group-containing dye, but the present invention is not limited thereto.

Further, two of $R^{203}$, $R^{204}$ and $R^{205}$, and $Ar^1$ and $Ar^2$ may be bonded through a single bond or a substituent.

The specific examples thereof include the following compounds but the present invention is not limited thereto.

(PAG3-1)

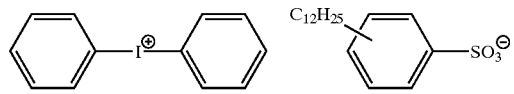

(PAG3-2)

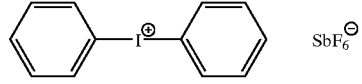

(PAG3-3)

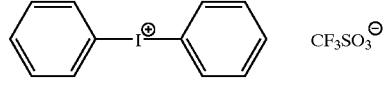

(PAG3-4)

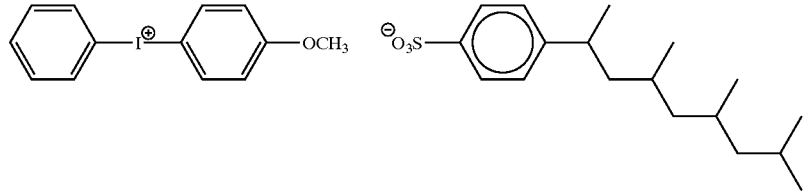

(PAG3-5)

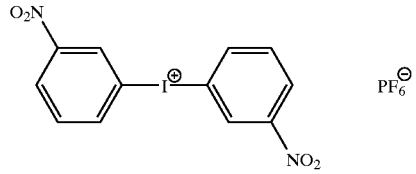

(PAG3-6)

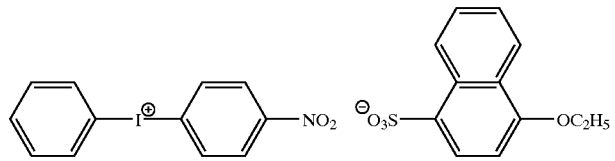

-continued
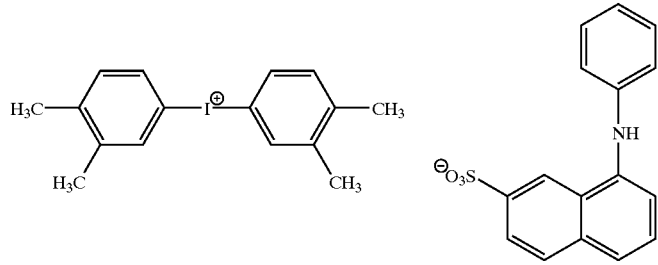
(PAG3-7)
(PAG3-8)
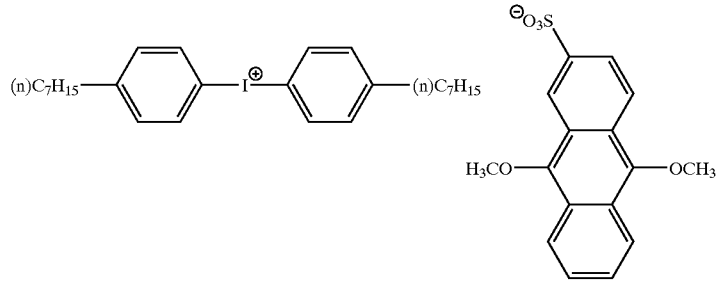
(PAG3-9)
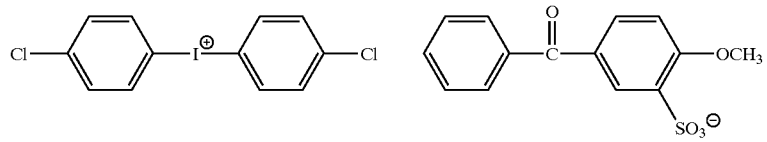
(PAG3-10)
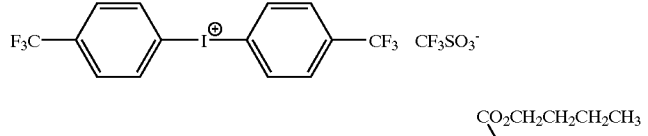
(PAG3-11)
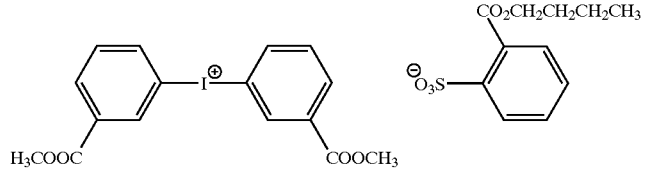
(PAG3-12)
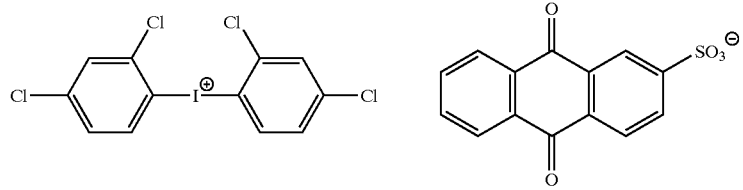
(PAG3-13)
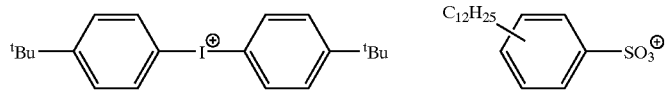
(PAG3-14)
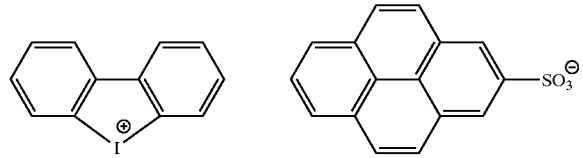
(PAG3-15)
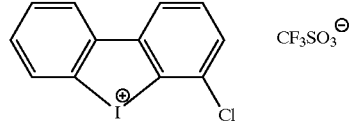

-continued
(PAG3-16)
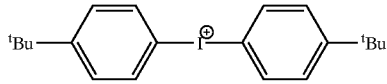 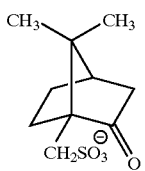
(PAG3-17)
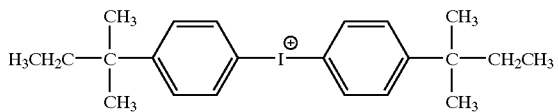 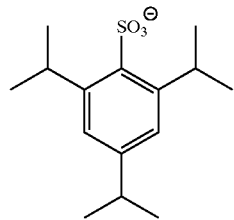
(PAG3-18)
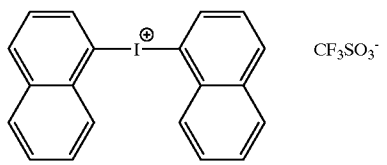 CF$_3$SO$_3^-$
(PAG3-19)
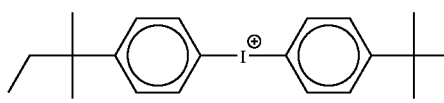 C$_4$F$_9$SO$_3^\ominus$
(PAG3-21)
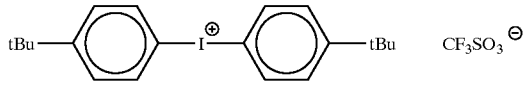 CF$_3$SO$_3^\ominus$
(PAG3-22)
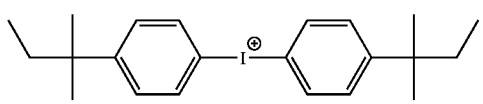 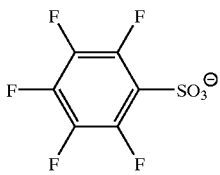
(PAG4-1)
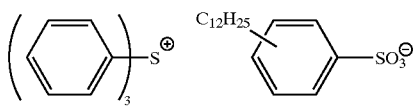
(PAG4-2)
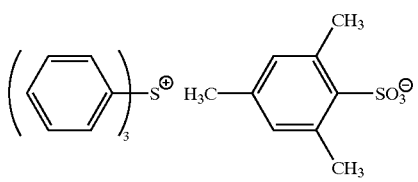
(PAG4-3)
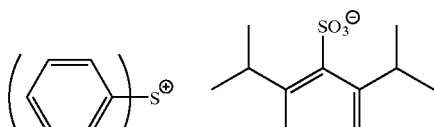 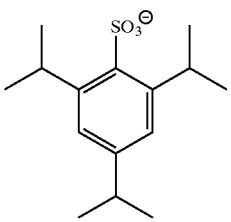
(PAG4-4)
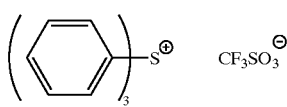 CF$_3$SO$_3^\ominus$ (PAG4-5)
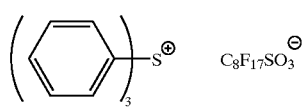
(PAG4-7)
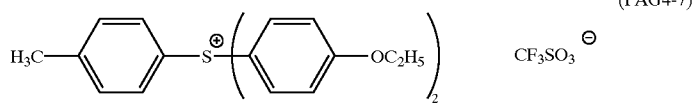
(PAG4-8)
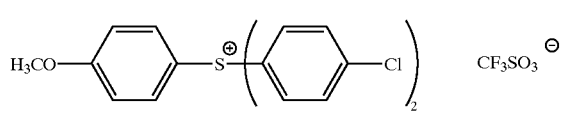
(PAG4-9)
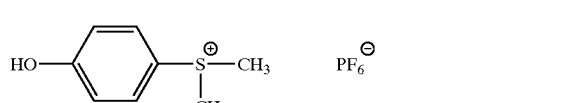
(PAG4-10)
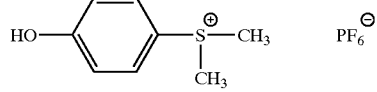
(PAG4-11)
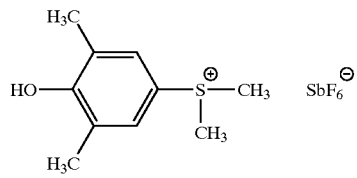
(PAG4-12)
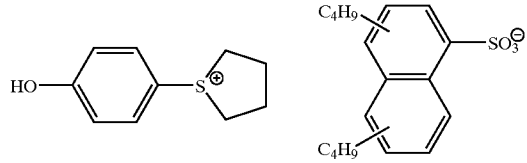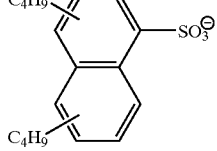
(PAG4-13)
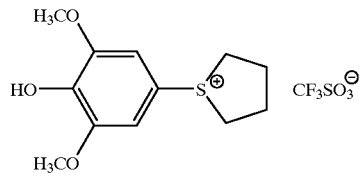
(PAG4-14)
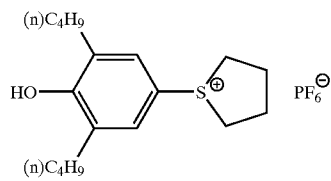
(PAG4-15)
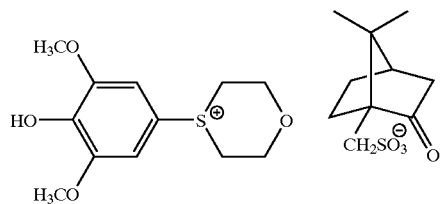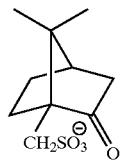
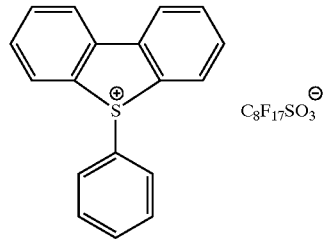

-continued
(PAG4-16)
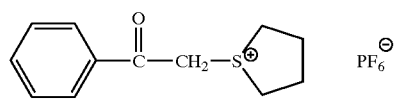
(PAG4-17)
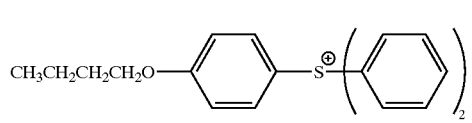 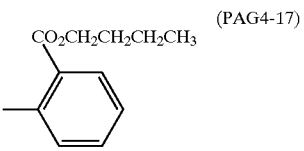
(PAG4-18)
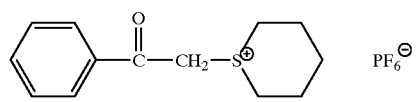
(PAG4-19)
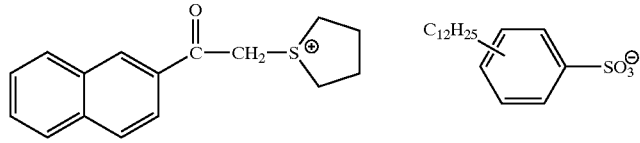
(PAG4-20)
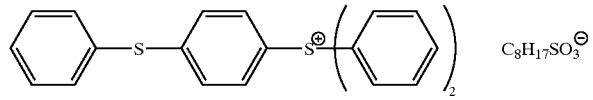
(PAG4-21)
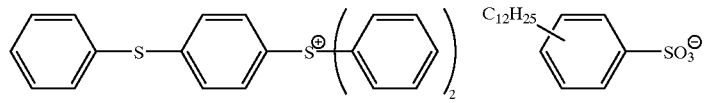
(PAG4-22)
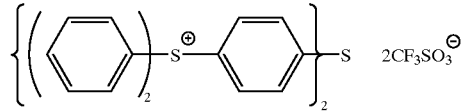
(PAG4-23)
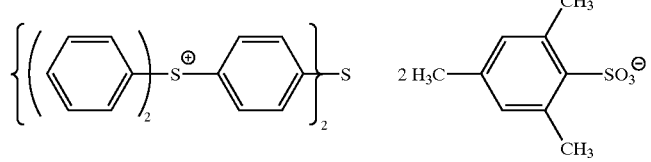
(PAG4-24)
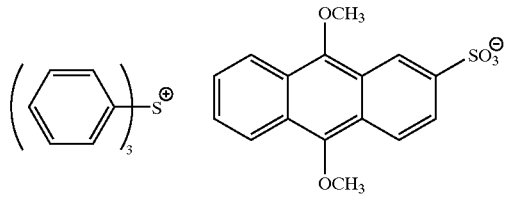
(PAG4-27)
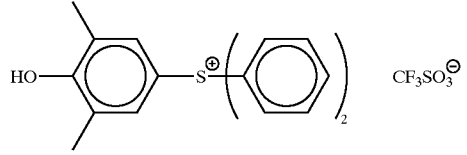
(PAG4-28)
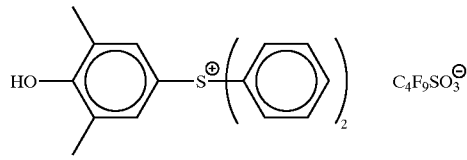

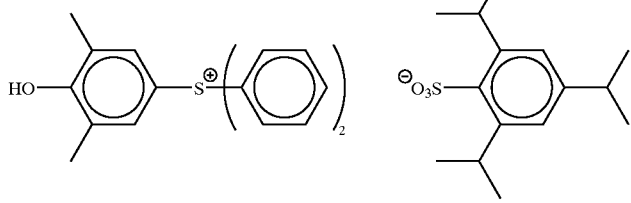
(PAG4-29)
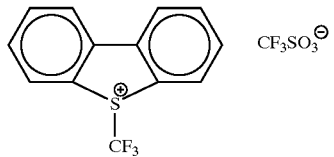
(PAG4-30)
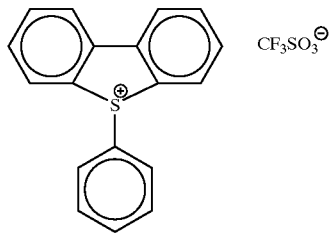
(PAG4-31)
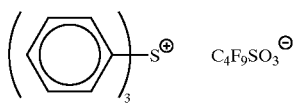
(PAG4-32)
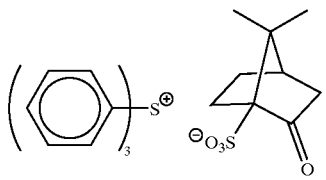
(PAG4-33)
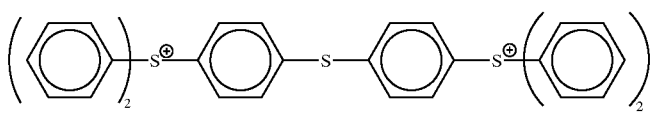
(PAG4-34)
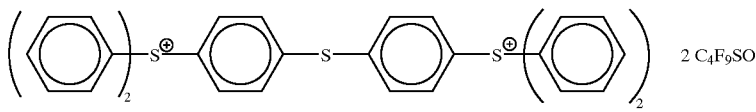
(PAG4-35)
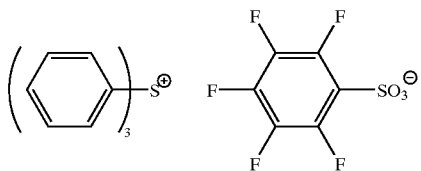
(PAG4-36)
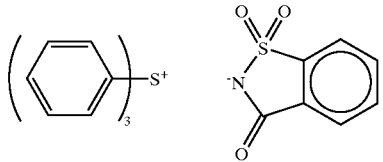
(PAG4-37)

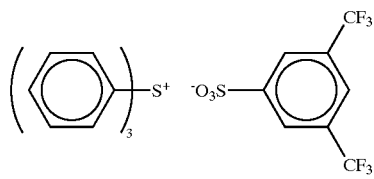
(PAG4-38)

Onium salts represented by formulae (PAG3) and (PAG4) are well-known compounds and can be synthesized according to the methods disclosed, e.g., in U.S. Pat. Nos. 2,807,648, 4,247,473, and JP-A-53-101331.

(3) A Disulfone Derivative Represented by the Following Formula (PAG5) or an Iminosulfonate Derivative Represented by the Following Formula (PAG6)

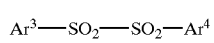
(PAG5)

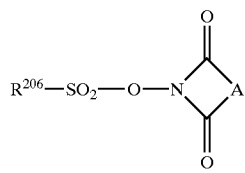
(PAG6)

wherein $Ar^3$ and $Ar^4$ each represents a substituted or unsubstituted aryl group; $R^{206}$ represents a substituted or unsubstituted alkyl group or a substituted or unsubstituted aryl group; and A represents a substituted or unsubstituted alkylene group, a substituted or unsubstituted alkenylene group, or a substituted or unsubstituted arylene group.

The specific examples thereof include the following compounds but the present invention is not limited thereto.

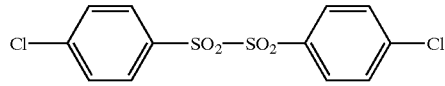
(PAG5-1)

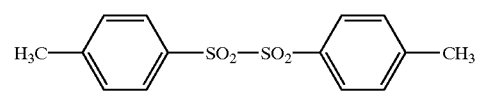
(PAG5-2)

(PAG5-3)

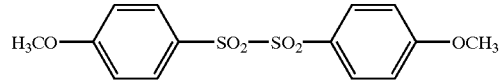
(PAG5-4)

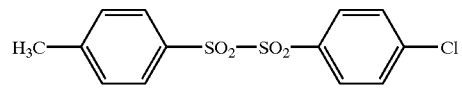
(PAG5-5)

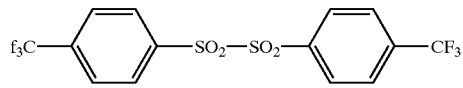

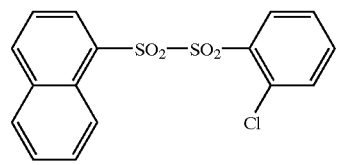
(PAG5-6)

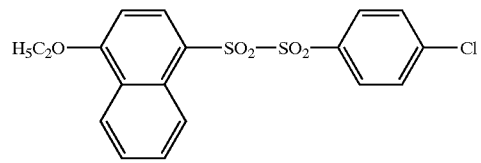
(PAG5-7)

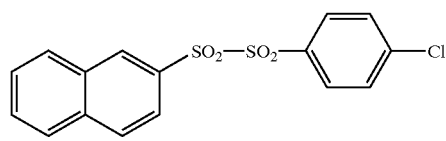
(PAG5-8)

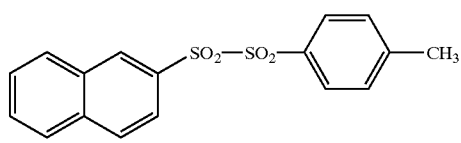
(PAG5-9)

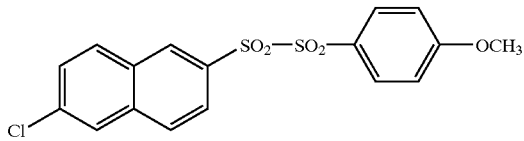
(PAG5-10)

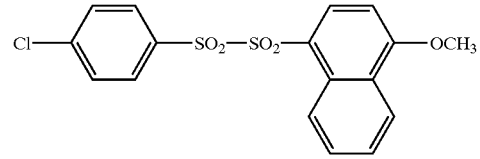
(PAG5-11)

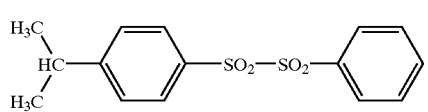
(PAG5-12)

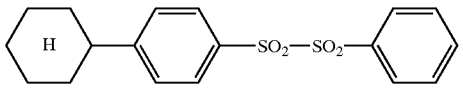
(PAG5-13)

-continued
(PAG6-1)
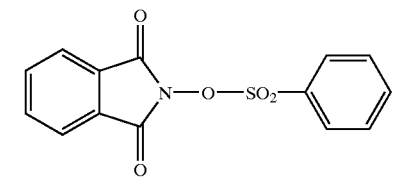
(PAG6-2)
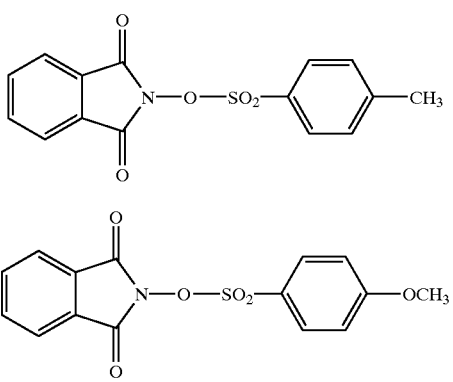
(PAG6-3)
(PAG6-4)
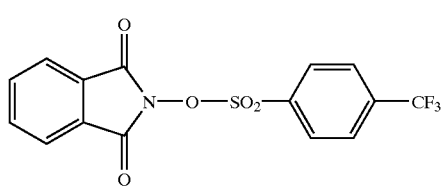
(PAG6-5)
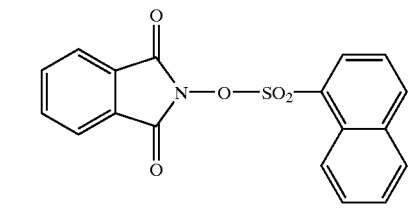
(PAG6-6)
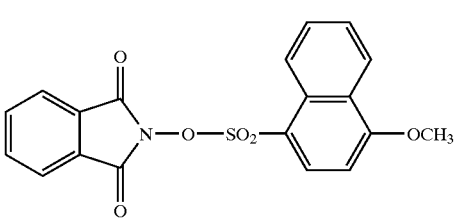
(PAG6-7)
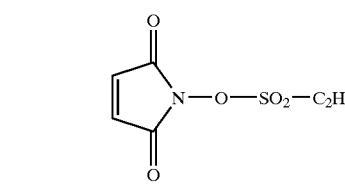
(PAG6-8)
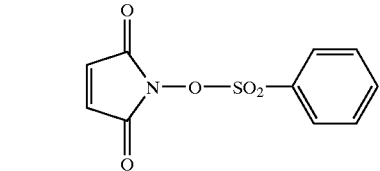
-continued
(PAG6-9)
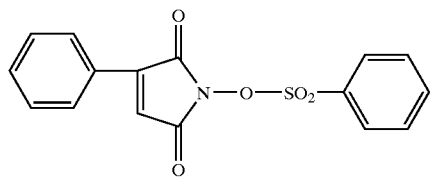
(PAG6-10)
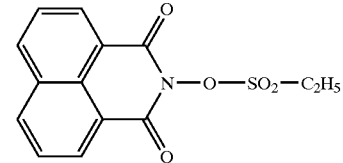
(PAG6-11)
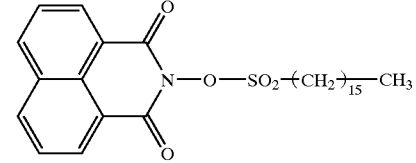
(PAG6-12)
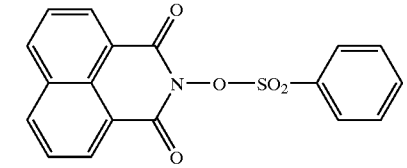
(PAG6-13)
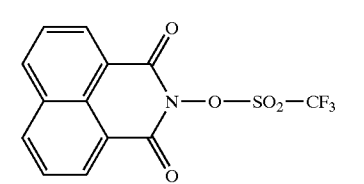
(4) A Diazodisulfone Derivative Represented by the Following Formula (PAG7).
(PAG7)
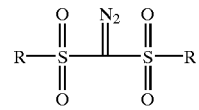
wherein R represents a straight chain, branched or cyclic alkyl group or an aryl group which may be substituted.
The specific examples thereof are shown below but the present invention is not limited thereto.
(PAG7-1)
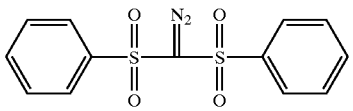
(PAG7-2)
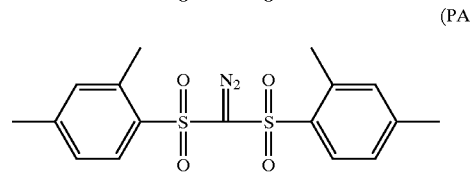

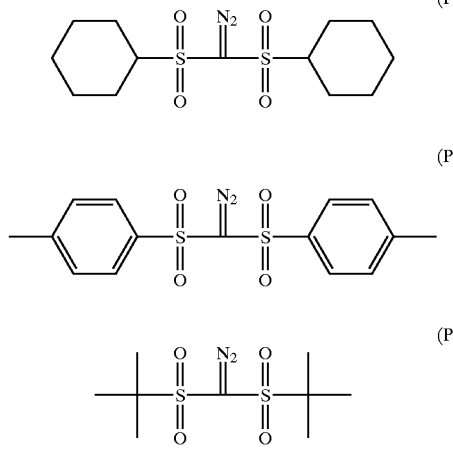

(PAG7-3)

(PAG7-4)

(PAG7-5)

[2] (B) Resin Having a Group Capable of Decomposing by the Action of an Acid to Increase the Solubility in an Alkali Developing Solution (Component (B))

Component (B) is used as the essential component in the first composition. The resin having a group capable of decomposing by the action of an acid to increase the solubility in an alkali developing solution is a resin having a group capable of decomposing by the action of an acid on the main chain or the side chain of the resin, or both on the main chain and the side chain. A resin having a group capable of decomposing by the action of an acid on the side chain is more preferred.

The group capable of decomposing by the action of an acid is preferably a —COO—$A^0$ group and an —O—$B^0$ group. Further, an —$R^0$—COO—$A^0$ group and an —Ar—O—$B^0$ group can be exemplified as the groups containing these groups.

Here, $A^0$ represents a —C($R^{01}$)($R^{02}$)($R^{03}$) group, an —Si($R^{01}$)($R^{02}$)($R^{03}$) group, or —C($R^{04}$)($R^{05}$)—O—$R^{06}$ group; $B^0$ represents $A^0$ or a —CO—O—$A^0$ group (wherein $R^0$, $R^{01}$, $R^{02}$, $R^{03}$, $R^{40}$, $R^{05}$, $R^{06}$, and Ar are the same as those described later).

The acid-decomposable group is preferably a silyl ether group, a cumyl ester group, an acetal group, a tetrahydropyranyl ether group, an enol ether group, an enol ester group, a tertiary alkyl ether group, a tertiary alkyl ester group, or a tertiary alkyl carbonate group, more preferably a tertiary alkyl ester group, a tertiary alkyl carbonate group, a cumyl ester group, an acetal group, or a tetrahydropyranyl ether group. An acetal group is particularly preferred.

In the case where the group capable of decomposing by the action of an acid is bonded to a resin as a side chain, the matrix resin is an alkali-soluble resin having an —OH group or a —COOH group, preferably an —$R^0$—COOH group or an —Ar—OH group, on a side chain. The alkali-soluble resins described later can be exemplified as such matrix resins, for instance.

Alkali-soluble resins preferably have an alkali-solubility of 170 Å/sec or more, particularly preferably 330 Å/sec or more, when measured with 0.261 N tetramethylammonium hydroxide (TMAH) at 23° C.

Further, alkali-soluble resins having high transmittance of far ultraviolet rays and excimer laser beams are preferred in view of achieving a rectangular profile. The transmittance at 218 nm is preferably from 20 to 90% with the layer thickness of 1 μm.

From this point of view, the examples of particularly preferred alkali-soluble resins include o-, m-, p-poly-(hydroxystyrene), and copolymers of them, hydrogenated poly-(hydroxystyrene), halogen- or alkyl-substituted poly(hydroxystyrene), a partially O-alkylated or O-acylated product of poly(hydroxystyrene), a styrene-hydroxystyrene copolymer, an α-methylstyrene-hydroxystyrene copolymer, and a hydrogenated novolak resin.

It is preferred that the acid-decomposable group of the present invention is a resin containing a hydroxystyrene repeating unit.

The resins having a group capable of decomposing by the action of an acid for use in the present invention can be obtained by reacting an alkali-soluble resin with the precursor of a group capable of decomposing with an acid, or by copolymerizing the alkali-soluble resin monomer having bonded thereto an acid-decomposable group with various monomers as disclosed in EP 254853, JP-A-2-25850, JP-A-3-223860 and JP-A-4-251259.

As the acid-decomposable resin, a resin containing a hydroxystyrene repeating unit and a repeating unit having an acid-decomposable group is preferred. Particularly, a resin containing a hydroxystyrene repeating unit and a hydroxystyrene repeating unit protected with an acid-decomposable group, or a resin containing a hydroxystyrene repeating unit and a (meth)acrylic acid ester repeating unit having an acid-decomposable group is preferred as the acid-decomposable resin. An acetal group is preferably used as this acid-decomposable group. Fluctuation of performances due to aging from irradiation to post-heating is reduced by using an acetal group. A 1-alkoxyethyl acetal group is preferred as the acetal group. 1-Alkoxyethyl acetal having a cyclic hydrocarbon group or an aromatic group in the acetal residue is more preferred. Dry etching resistance can be improved by using these acetal groups.

The specific examples of the resins having a group capable of decomposing by the action of an acid for use in the present invention are shown below, however, these compounds should not be construed as limiting the scope of the present invention.

p-t-Butoxystyrene/p-hydroxystyrene copolymer,
p-(t-Butoxycarbonyloxy)styrene/p-hydroxystyrene copolymer,
p-(t-Butoxycarbonylmethyloxy)styrene/p-hydroxystyrene copolymer,
4-(t-Butoxycarbonylmethyloxy)-3-methylstyrene/4-hydroxy-3-methylstyrene copolymer,
p-(t-Butoxycarbonylmethyloxy)styrene/p-hydroxystyrene (10% hydrogenated product) copolymer,
m-(t-Butoxycarbonylmethyloxy)styrene/m-hydroxystyrene copolymer,
o-(t-Butoxycarbonylmethyloxy)styrene/o-hydroxystyrene copolymer,
p-(Cumyloxycarbonylmethyloxy)styrene/p-hydroxystyrene copolymer,
Cumyl methacrylate/methyl methacrylate copolymer,
4-t-Butoxycarbonylstyrene/dimethyl maleate copolymer,
Benzyl methacrylate/tetrahydropyranyl methacrylate copolymer,
p-(t-Butoxycarbonylmethyloxy)styrene/p-hydroxystyrene/styrene copolymer,
p-t-Butoxystyrene/p-hydroxystyrene/fumaronitrile copolymer,
t-Butoxystyrene/hydroxyethyl methacrylate copolymer,
Styrene/N-(4-hydroxyphenyl)maleimide/N-(4-t-butoxycarbonyloxyphenyl)maleimide copolymer, p-Hydroxystyrene/t-butyl methacrylate copolymer,
Styrene/p-hydroxystyrene/t-butyl methacrylate copolymer,
p-Hydroxystyrene/t-butyl acrylate copolymer,
Styrene/p-hydroxystyrene/t-butyl acrylate copolymer,
p-(t-Butoxycarbonylmethyloxy)styrene/p-hydroxystyrene/ N-methylmaleimide copolymer,
t-Butyl methacrylate/1-adamantylmethyl methacrylate copolymer,
p-Hydroxystyrene/t-butyl acrylate/p-acetoxystyrene copolymer,
p-Hydroxystyrene/t-butyl acrylate/p-(t-butoxycarbonyloxy)styrene copolymer, and
p-Hydroxystyrene/t-butyl acrylate/p-(t-butoxycarbonylmethyloxy)styrene copolymer.

Resins containing the repeating structural units represented by the following formulae (IV) and (V) are preferably used in the present invention as the resin having a group capable of decomposing by the action of an acid (component (B)). By using these resins, high resolution can be ensured, further, fluctuation of performances due to aging from irradiation to heating is reduced.

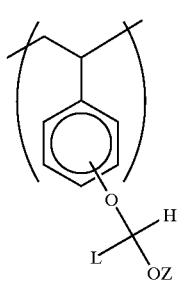

(IV)

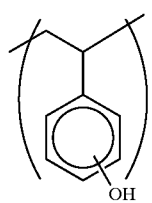

(V)

In formula (IV), L represents a hydrogen atom, a straight chain, branched or cyclic alkyl group which may be substituted, or an aralkyl group which maybe substituted; and Z represents a straight chain, branched or cyclic alkyl group which may be substituted, or an aralkyl group which may be substituted; Z and L may be bonded to form a 5- or 6-membered ring.

The alkyl group represented by L and Z in formula (IV) includes a straight chain, branched or cyclic alkyl group having from 1 to 20 carbon atoms, e.g., a methyl group, an ethyl group, a propyl group, an isopropyl group, an n-butyl group, an isobutyl group, a t-butyl group, a pentyl group, a cyclopentyl group, a hexyl group, a cyclohexyl group, an octyl group and a dodecyl group.

The preferred substituents of the alkyl group include an alkyl group, an alkoxyl group, a hydroxyl group, a halogen atom, a nitro group, an acyl group, an acylamino group, a sulfonylamino group, an alkylthio group, an arylthio group and an aralkylthio group, e.g., a cyclohexylethyl group, an alkylcarbonyloxymethyl group, an alkylcarbonyloxyethyl group, an arylcarbonyloxyethyl group, an aralkylcarbonyloxyethyl group, an alkyloxymethyl group, an aryloxymethyl group, an aralkyloxymethyl group, an alkyloxyethyl group, an aryloxyethyl group, an aralkyloxyethyl group, an alkylthiomethyl group, an arylthiomethyl group, an aralkylthiomethyl group, an alkylthioethyl group, an arylthioethyl group, and an aralkylthioethyl group. The alkyl group is not especially limited, and any of chain, cyclic or branched alkyl groups can be used, e.g., a cyclohexylcarbonyloxyethyl group, a t-butylcyclohexylcarbonyloxyethyl group, and an n-butylcyclohexylcarbonyloxyethyl group can be exemplified. The aryl group is not also especially limited, e.g., a phenyloxyethyl group can be exemplified, which group may further be substituted, e.g., a cyclohexylphenyloxyethyl group can be exemplified. The aralkyl group is also not especially limited, e.g., a benzylcarbonyloxyethyl group can be exemplified.

As the aralkyl group represented by L and Z, an aralkyl group having from 7 to 15 carbon atoms, e.g., a substituted or unsubstituted benzyl group and a substituted or unsubstituted phenethyl group can be exemplified. The preferred substituents of the aralkyl group are an alkoxyl group, a hydroxyl group, a halogen atom, a nitro group, an acyl group, an acylamino group, a sulfonylamino group, an alkylthio group, an arylthio group and an aralkylthio group, e.g., an alkoxybenzyl group, a hydroxybenzyl group, and a phenylthiophenethyl group can be exemplified.

It is preferred that Z represents a substituted alkyl group or a substituted aralkyl group in view of further improvement of edge roughness. The preferred substituents of the alkyl group include a cyclic alkyl group, an aryloxy group, an alkylcarboxyl group, an arylcarboxyl group, and an aralkylcarboxyl group, and the preferred substituents of the aralkyl group are an alkyl group, a cyclic alkyl group and a hydroxyl group.

It is preferred in view of the improvement of the dry etching resistance that Z represents an aromatic group or a group having a mono-cyclic or poly-cyclic alkyl group.

As the 5- or 6-membered ring formed by L and Z by bonding to each other, a tetrahydropyran ring and a tetrahydrofuran ring can be exemplified.

The ratio of the repeating structural unit represented by formula (IV) and the repeating structural unit represented by formula (V) in the resin is preferably from 1/99 to 60/40, more preferably from 5/95 to 50/50, and still more preferably from 10/90 to 40/60.

The resin containing the repeating structural units represented by formulae (IV) and (V) may contain structural units derived from other monomers.

As such other monomers, hydrogenated hydroxystyrene; halogen-, alkoxy- or alkyl-substituted hydroxystyrene; styrene; halogen-, alkoxy-, acyloxy- or alkyl-substituted styrene; maleic anhydride; acrylic acid derivative; methacrylic acid derivative; and N-substituted maleimide can be exemplified, but other monomers are not limited thereto.

The ratio of the structural units represented by formulae (IV) and (V) and the structural units derived from other monomers [(IV)+(V)/(other monomer components)] is in molar ratio of from 100/0 to 50/50, preferably from 100/0 to 60/40, and still more preferably from 100/0 to 70/30.

The specific examples of the resins containing the structural units represented by formulae (IV) and (V) according to the present invention and other resins which can be used in the present invention are shown below.

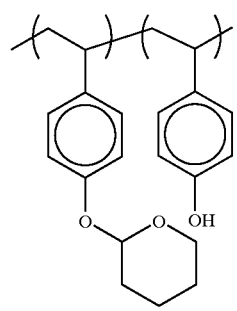 (A-1)
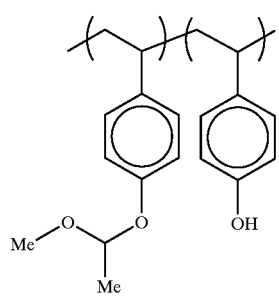 (A-2)
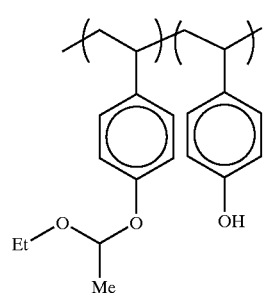 (A-3)
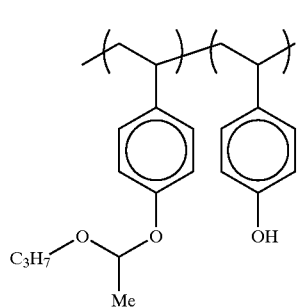 (A-4)
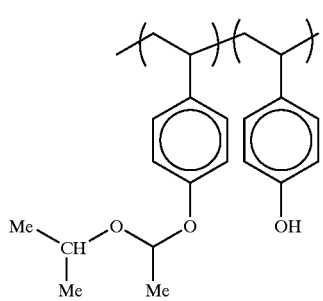 (A-5)
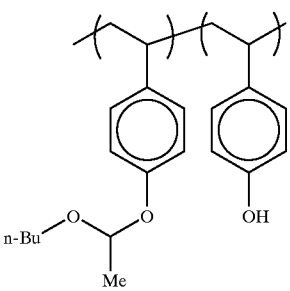 (A-6)
(A-7)
(A-8)
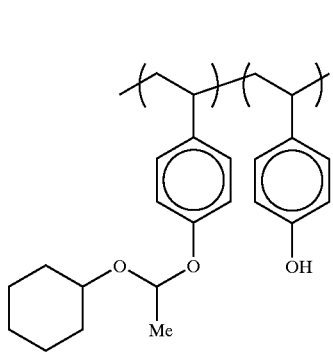 (A-9)
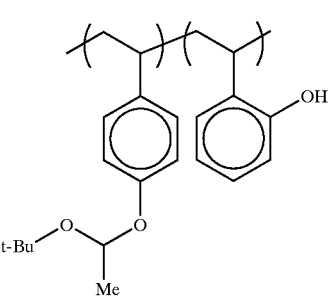 (A-10)

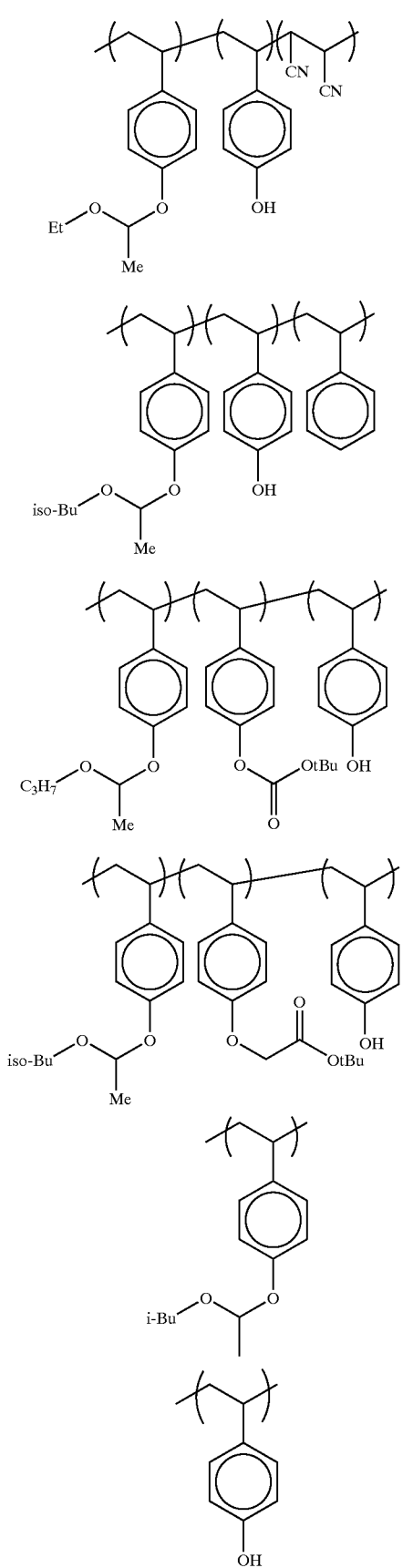

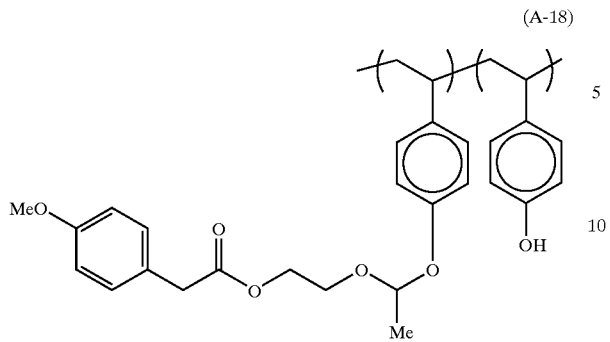
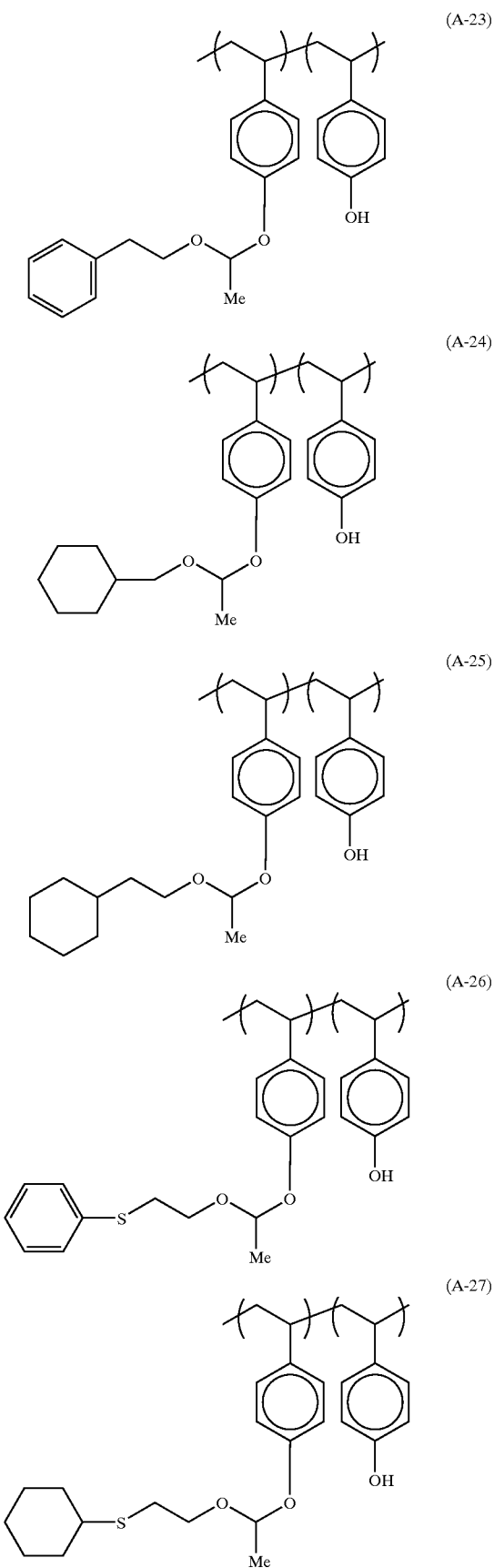

-continued
(A-28)
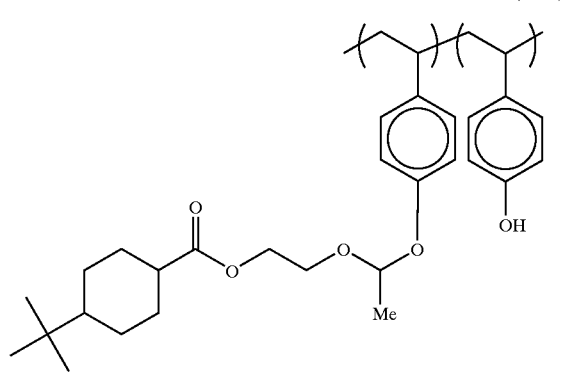
(A-29)
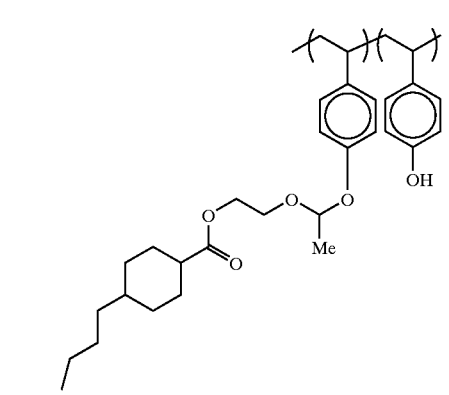
(A-30)
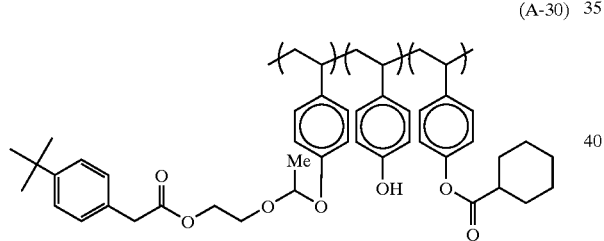
(A-31)
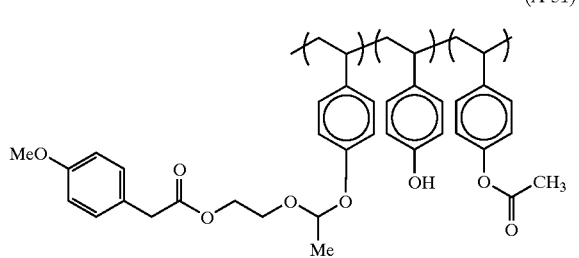
(A-32)
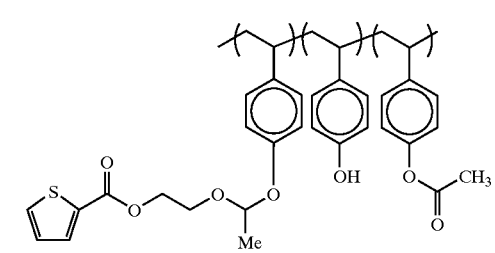
-continued
(A-33)
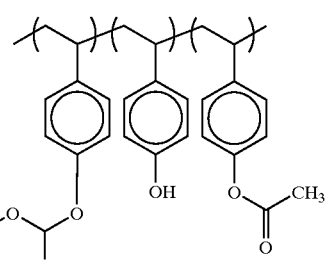
(A-34)
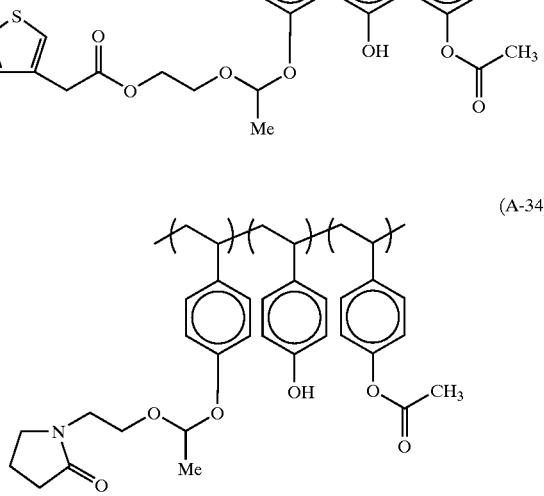
(A-35)
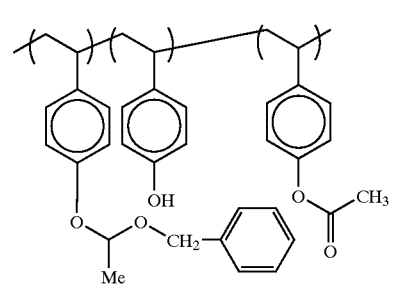
(A-36)
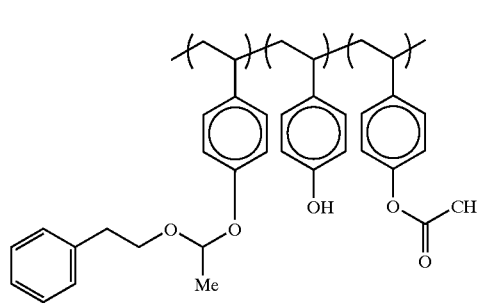
(A-37)
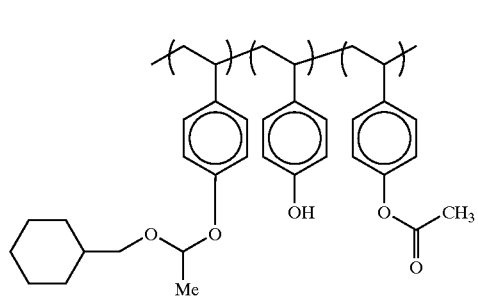

(A-38)
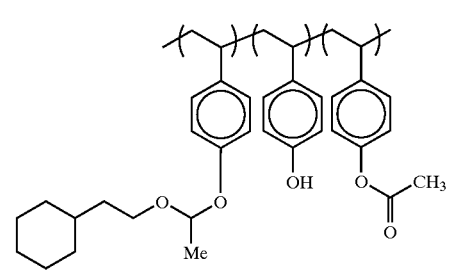
(A-43)
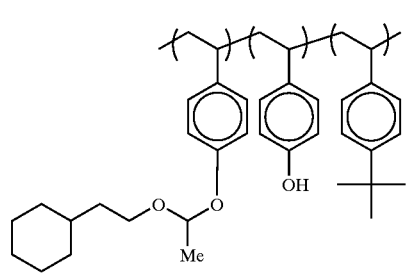
(A-39)
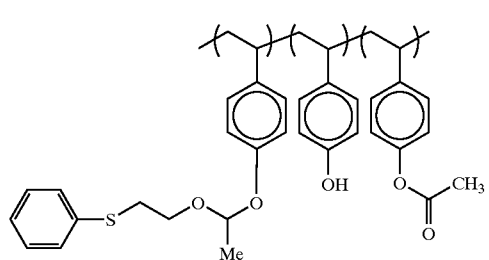
(A-44)
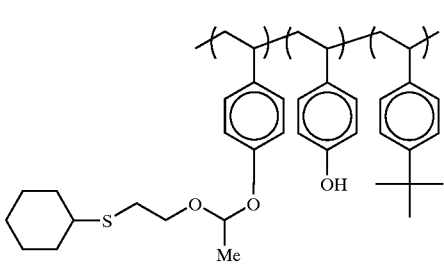
(A-40)
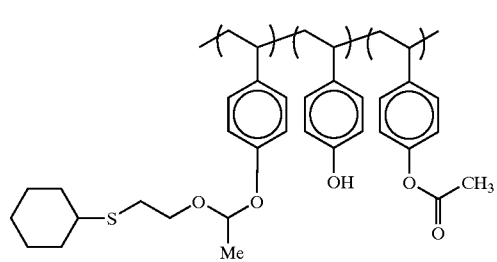
(A-45)
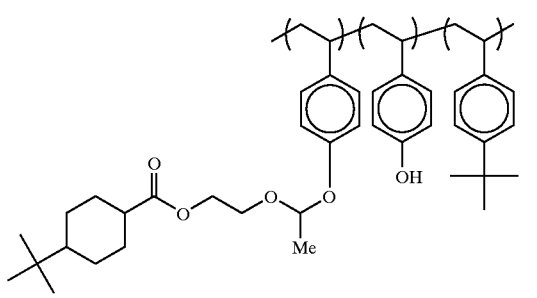
(A-41)
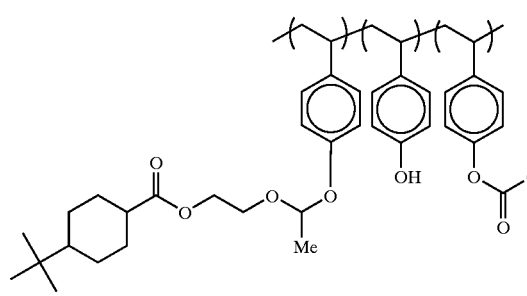
(A-46)
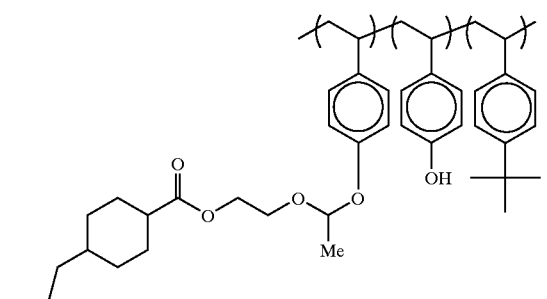
(A-42)
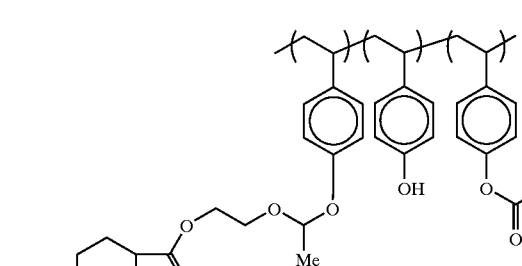
(A-47)
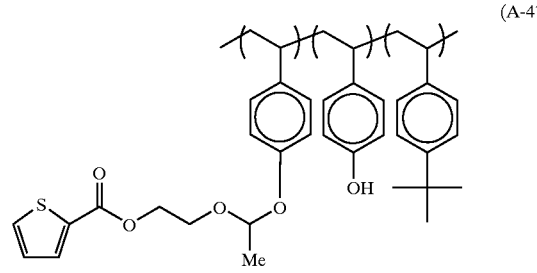
(A-48)
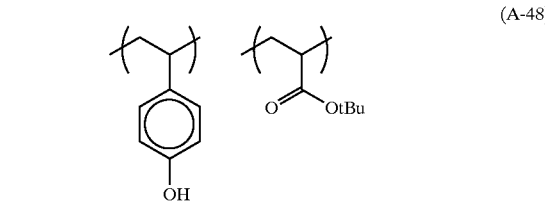

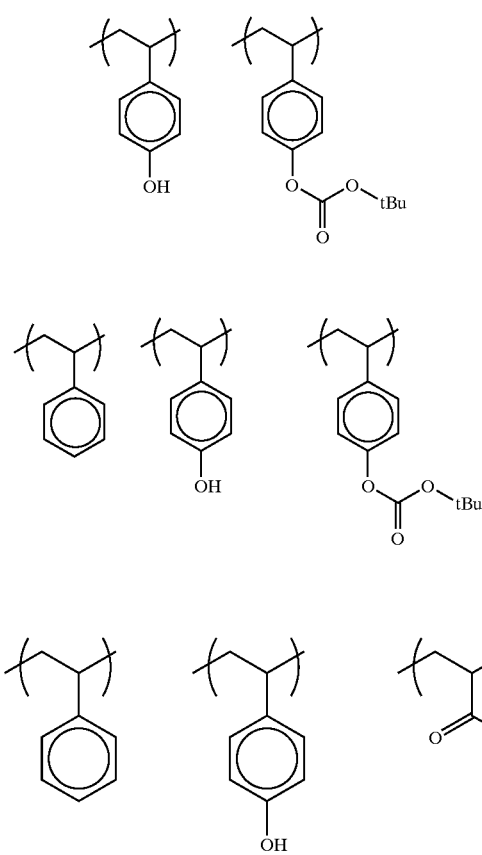

(A-49)

(A-50)

(A-51)

In the above specific examples, Me represents a methyl group, Et an ethyl group, nBu an n-butyl group, iso-Bu an isobutyl group, and tBu represents a t-butyl group.

When an acetal group is used as the acid-decomposable group, a polyhydroxyl compound may be added in the stage of synthesis to introduce a crosslinking moiety for linking the main chain of the polymer to the polyfunctional acetal group for the purpose of adjusting alkali dissolving velocity and improving heat resistance. The addition amount of the polyhydroxyl compound is preferably from 0.01 to 5 mol %, more preferably 0.05 to 4 mol %, based on the amount of the hydroxyl groups of the resin. As the polyhydroxyl compound, those having from 2 to 6 phenolic hydroxyl groups or alcoholic hydroxyl groups, preferably those having from 2 to 4 hydroxyl groups, and more preferably those having 2 or 3 hydroxyl groups are exemplified. The specific examples of polyhydroxyl compounds are shown below but the present invention is not limited thereto.

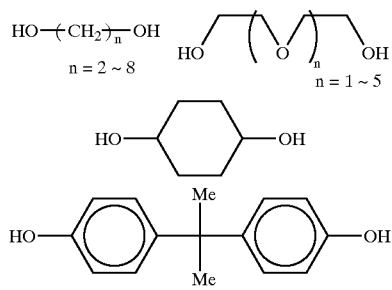

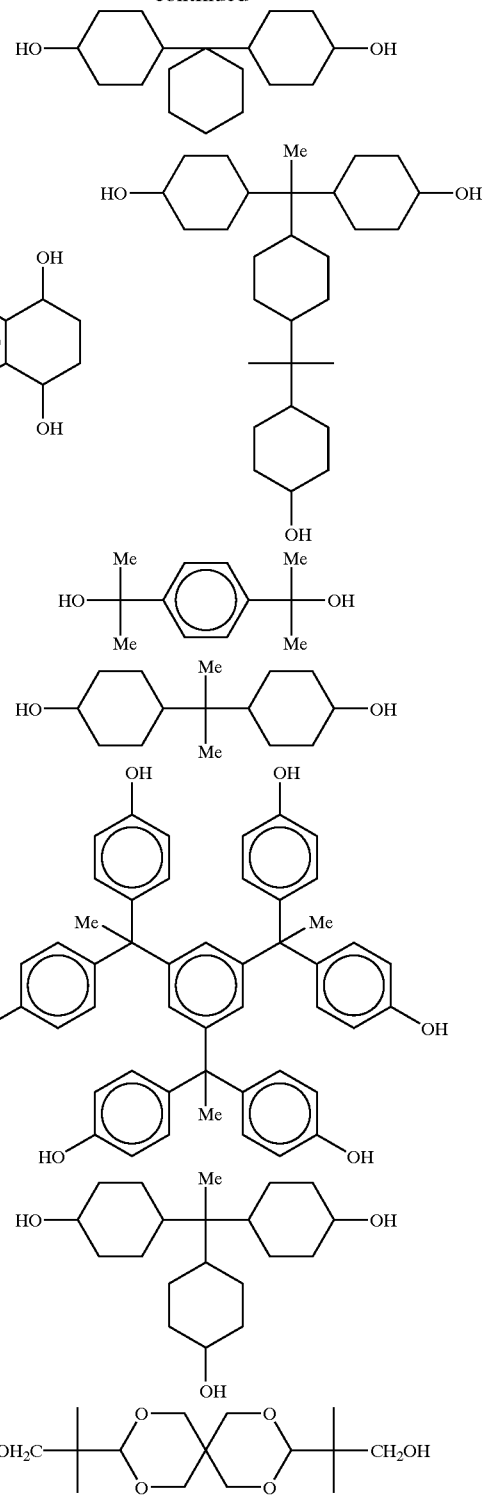

The weight average molecular weight (Mw) of the resin having a group capable of decomposing by the action of an acid (component (B)) is preferably from 2,000 to 300,000. If the weight average molecular weight is less than 2,000, a great film thickness loss is caused in the unexposed area by development and, on the contrary, when it exceeds 300,000, the alkali-soluble resin itself decreases in the dissolution rate in an alkali, which causes a decrease in sensitivity. The weight average molecular weight as used herein is defined as a value calculated in terms of polystyrene by gel permeation chromatography.

Component (B) of the positive radiation-sensitive composition in the present invention, i.e., the resin having an acid-decomposable group can be used in combination of two kinds or more.

The use amount of component (B) is from 40 to 99 wt %, preferably from 60 to 98 wt %, based on the solid content in the first composition of the present invention.

[3] (C) Compound Having a Molecular Weight of 3,000 or Less Which is Capable of Decomposing by the Action of an Acid to Increase the Solubility in an Alkali Developing Solution (Component (C))

Component (C) is used as the essential component in the second composition, and mixed in the first composition according to necessity. Component (C) is a low molecular weight compound having a molecular weight of 3,000 or less, preferably from 200 to 2,000, more preferably from 300 to 1,500, has an acid-decomposable group and is capable of increasing the solubility in an alkali developing solution by the action of an acid. Component (C) functions as a dissolution-inhibiting compound of an non-irradiated area in an alkali developing solution. In the following, "acid-decomposable dissolution-inhibiting compound" has the same meaning as component (C).

Preferred component (C), i.e., a preferred acid-decomposable dissolution-inhibiting compound, is a compound having at least two acid-decomposable groups in the structure, and the contiguous acid-decomposable groups are separated from each other at the remotest site via at least 8 bonding atoms exclusive of the acid-decomposable groups.

More preferred component (C) is:

(a) a compound having at least two acid-decomposable groups in the structure, where the contiguous acid-decomposable groups are separated from each other at the remotest site via at least 10 bonding atoms, preferably at least 11, and more preferably at least 12, exclusive of the acid-decomposable groups, or (b) a compound containing at least three acid-decomposable groups in the structure, where the contiguous acid-decomposable groups are separated from each other at the remotest site via at least 9 bonding atoms, preferably at least 10, and more preferably at least 11, exclusive of the acid-decomposable groups.

The upper limit of the number of bonding atoms is preferably 50 and more preferably 30.

When an acid-decomposable dissolution inhibiting compound has three or more, preferably four or more acid-decomposable groups, or even when the compound has two acid-decomposable groups, the dissolution inhibiting property to an alkali-soluble resin is conspicuously increased insofar as the contiguous acid-decomposable groups are separated from each other more than a definite distance.

The distance between contiguous acid-decomposable groups is indicated by the number of bonding atoms present en route exclusive of the acid-decomposable groups. For example, in the cases of the following compounds (1) and (2), the distances between contiguous acid-decomposable groups are respectively 4 bonding atoms, and in the case of compound (3), the distance is 12 bonding atoms.

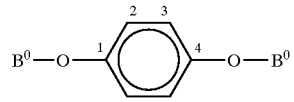

(1)

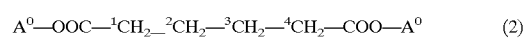

(2)

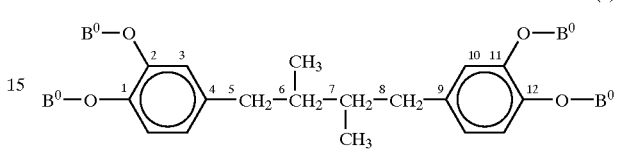

(3)

Acid-decomposable groups: —COO—$A^0$, —O—$B^0$

Further, an acid-decomposable dissolution inhibiting compound may have a plurality of acid-decomposable groups on one benzene ring, but a compound constructed by a skeleton having one acid-decomposable group on one benzene ring is preferred.

The group containing a group decomposable by the action of an acid, i.e., a —COO—$A^0$ group and an —O—$B^0$ group, includes an —$R^0$—COO—$A^0$ group and an —Ar—O—$B^0$ group.

Here, $A^0$ represents a —$C(R^{01})(R^{02})(R^{03})$ group, an —Si$(R^{01})(R^{02})(R^{03})$ group, or —$C(R^{04})(R^{05})$—O—$R^{06}$ group; $B^0$ represents $A^0$ or a —CO—O—$A^0$ group.

$R^{01}$, $R^{02}$, $R^{03}$, $R^{04}$ and $R^{05}$, which may be the same or different, each represents a hydrogen atom, an alkyl group, a cycloalkyl group, an alkenyl group, or an aryl group; and $R^{06}$ represents an alkyl group or an aryl group; provided that at least two of $R^{01}$, $R^{02}$ and $R^{03}$ are groups other than a hydrogen atom, and that two of respective groups $R^{01}$ to $R^{03}$, and $R^{04}$ to $R^{06}$ may be bonded to form a ring. $R^0$ represents a divalent or greater aliphatic or aromatic hydrocarbon group which may have a substituent, and —Ar— represents a divalent or greater aromatic group which may have a monocyclic or polycyclic substituent.

The alkyl group is preferably an alkyl group having from 1 to 4 carbon atoms (e.g., methyl, ethyl, propyl, n-butyl, sec-butyl, t-butyl), the cycloalkyl group is preferably a cycloalkyl group having from 3 to 10 carbon atoms (e.g., cyclopropyl, cyclobutyl, cyclohexyl, adamantyl), the alkenyl group is preferably an alkenyl group having from 2 to 4 carbon atoms (e.g., vinyl, propenyl, allyl, butenyl), and the aryl group is preferably an aryl group having from 6 to 14 carbon atoms (e.g., phenyl, xylyl, toluyl, cumenyl, naphthyl, anthracenyl).

Further, the examples of the substituents include a hydroxyl group, a halogen atom (e.g., fluorine, chlorine, bromine, iodine), a nitro group, a cyano group, the above-described alkyl group, an alkoxyl group (e.g., methoxy, ethoxy, hydroxyethoxy, propoxy, hydroxypropoxy, n-butoxy, isobutoxy, sec-butoxy, t-butoxy), an alkoxycarbonyl group (e.g., methoxycarbonyl, ethoxycarbonyl), an aralkyl group (e.g., benzyl, phenethyl, cumyl), an aralkyloxy group, an acyl group (e.g., formyl, acetyl, butyryl, benzoyl, cyanamyl, valeryl), an acyloxy group (e.g., butyryloxy), the above-described alkenyl group, an alkenyloxy group (e.g., vinyloxy, propenyloxy, allyloxy, butenyloxy), the above-described aryl group, an aryloxy group (e.g., phenoxy), and an aryloxycarbonyl group (e.g., benzoyloxy).

The examples of the preferred acid-decomposable groups are a silyl ether group, a cumyl ester group, an acetal group, a tetrahydropyranyl ether group, an enol ether group, an enol ester group, a tertiary alkyl ether group, a tertiary alkyl ester group, and a tertiary alkylcarbonate group, and the more preferred groups are a tertiary alkyl ester group, a tertiary alkyl carbonate group, a cumyl ester group, and a tetrahydropyranyl ether group.

The preferred examples of component (C) include the compounds obtained by bonding and protecting a part or all of the phenolic OH group contained in the polyhydroxy compounds as disclosed in the following patents with an $-R^0-COO-A^0$ group or a $B^0$ group. The foregoing polyhydroxy compounds are disclosed in JP-A-1-289946, JP-A-1-289947, JP-A-2-2560, JP-A-3-128959, JP-A-3-158855, JP-A-3-179353, JP-A-3-191351, JP-A-3-200251, JP-A-3-200252, JP-A-3-200253, JP-A-3-200254, JP-A-3-200255, JP-A-3-259149, JP-A-3-279958, JP-A-3-279959, JP-A-4-1650, JP-A-4-1651, JP-A-4-11260, JP-A-4-12356, JP-A-4-12357, JP-A-4-271349, JP-A-5-45869, JP-A-5-158233, JP-A-5-224409, JP-A-5-257275, JP-A-5-297581, JP-A-5-297583, JP-A-5-303197, JP-A-5-303200 and JP-A-5-341510.

Of these compounds, the compounds prepared using the polyhydroxy compounds disclosed in JP-A-1-289946, JP-A-3-128959, JP-A-3-158855, JP-A-3-179353, JP-A-3-200251, JP-A-3-200252, JP-A-3-200255, JP-A-3-259149, JP-A-3-279958, JP-A-4-1650, JP-A-4-11260, JP-A-4-12356, JP-A-4-12357, JP-A-5-224409, JP-A-5-297581, JP-A-5-297583, JP-A-5-303197, JP-A-5-303200 and JP-A-5-341510 are more preferred.

The specific examples of preferred compound skeletons are shown below.

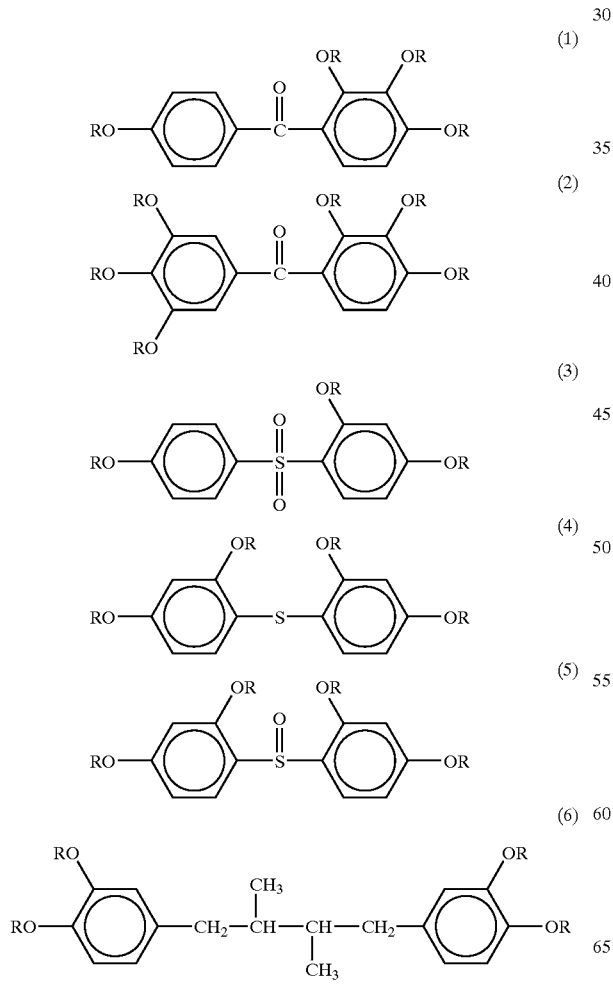

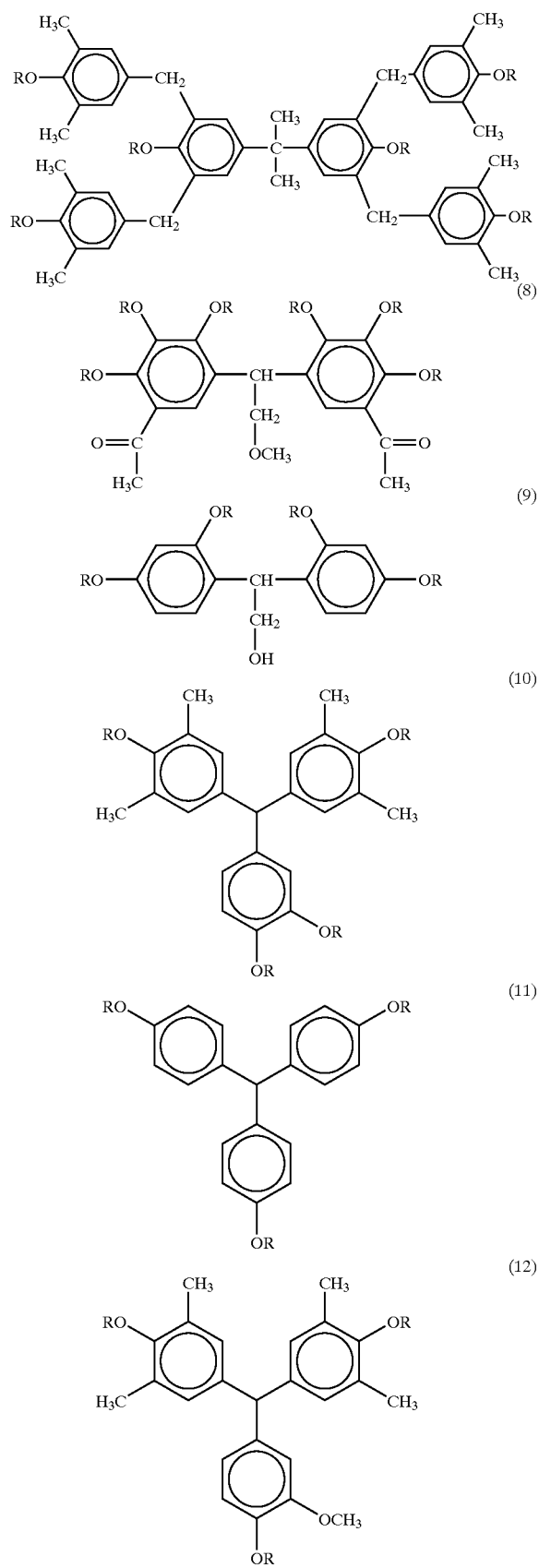

(13)
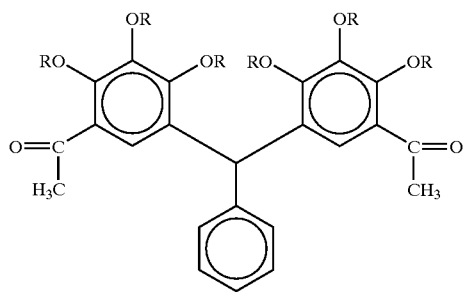
(14)
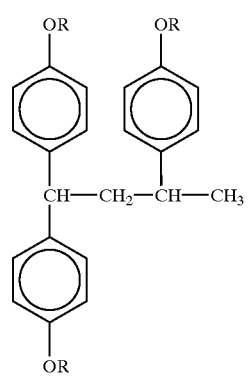
(15)
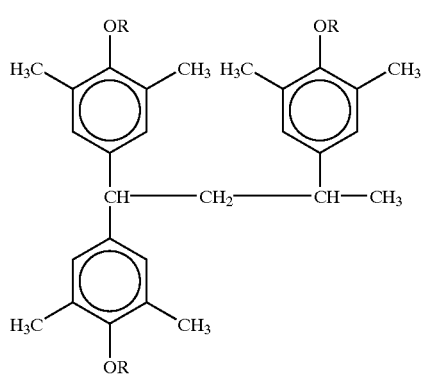
(16)
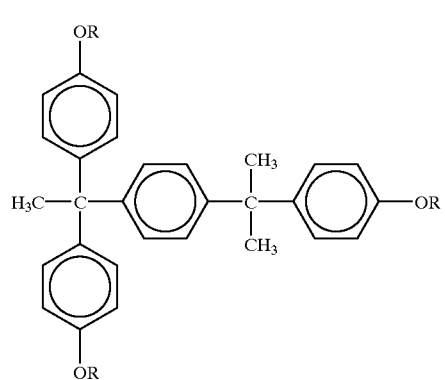
(17)
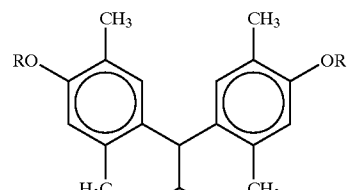
(18)
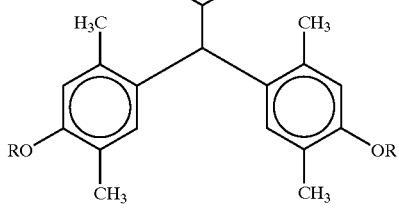
(19)
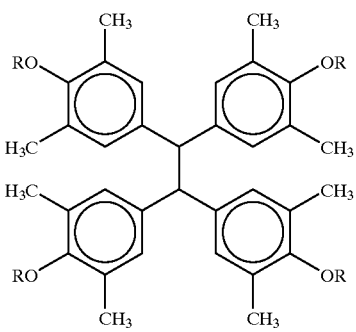
(20)
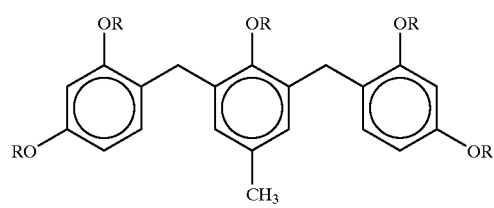
(21)
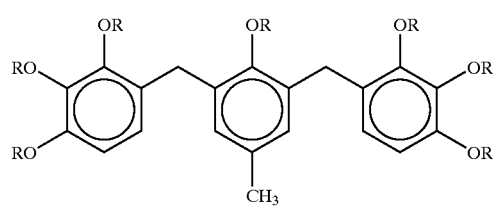
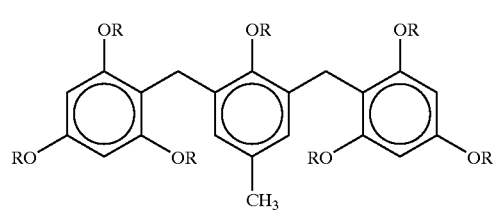

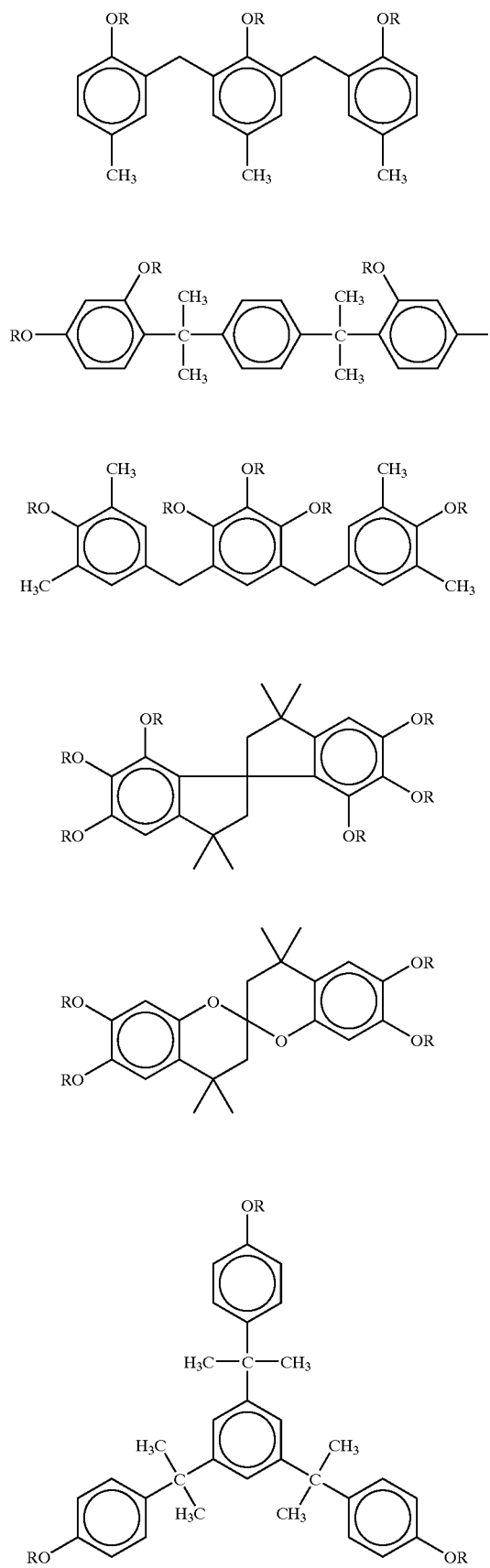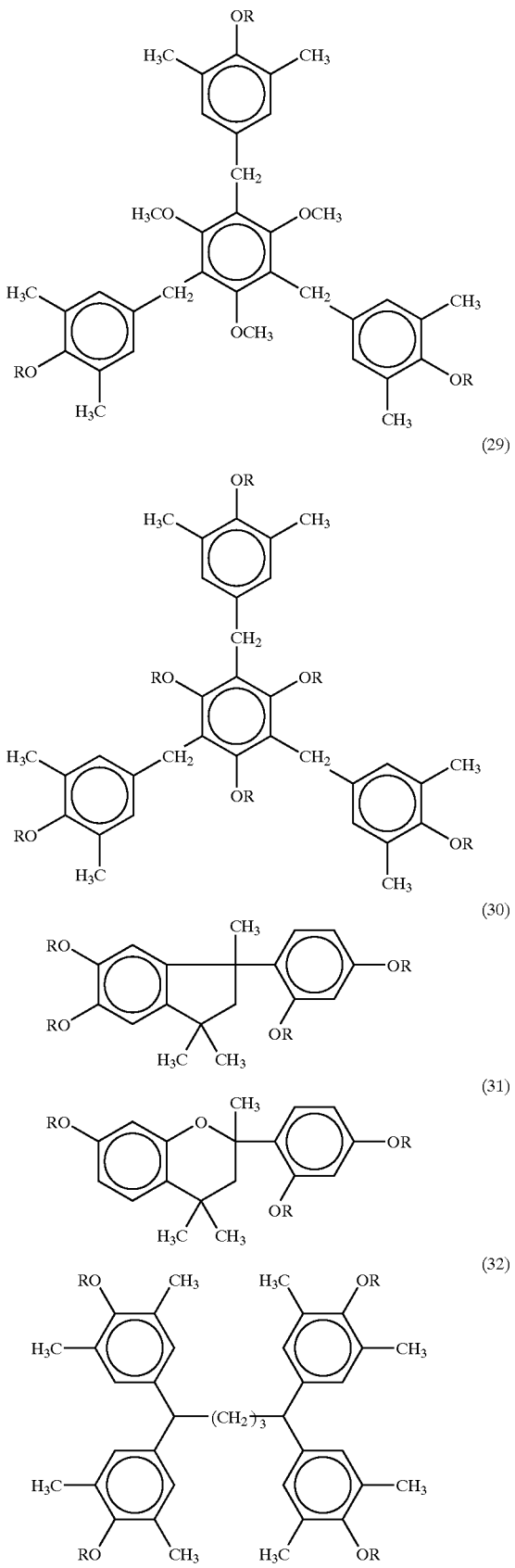

(33)
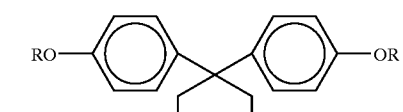
(34)
(35)
(36)
(37)
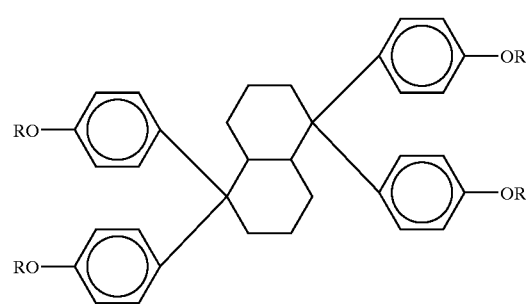
(38)
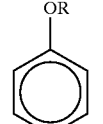
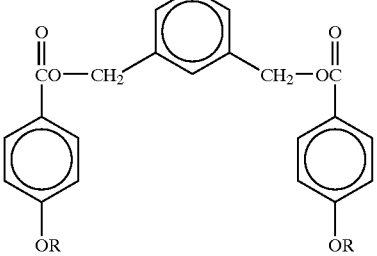
(39)
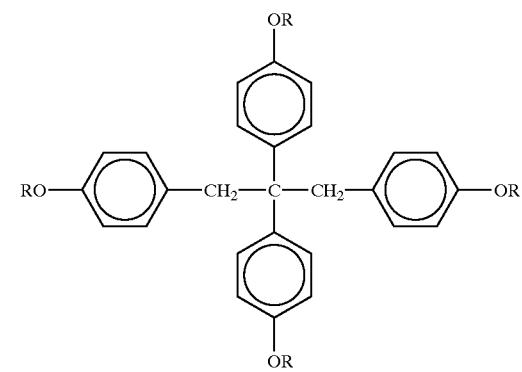
(40)
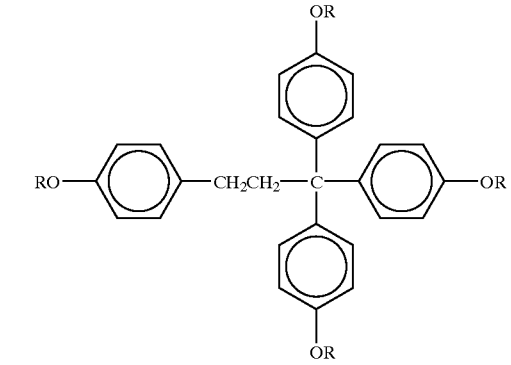
(41)
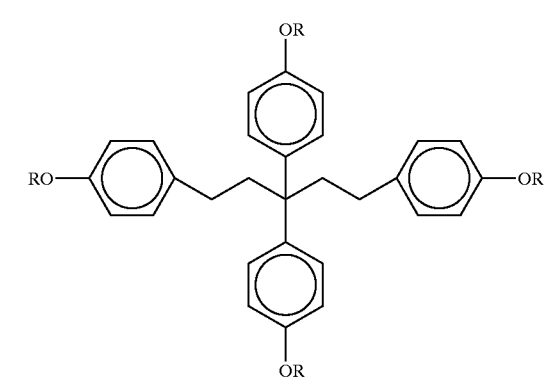

-continued

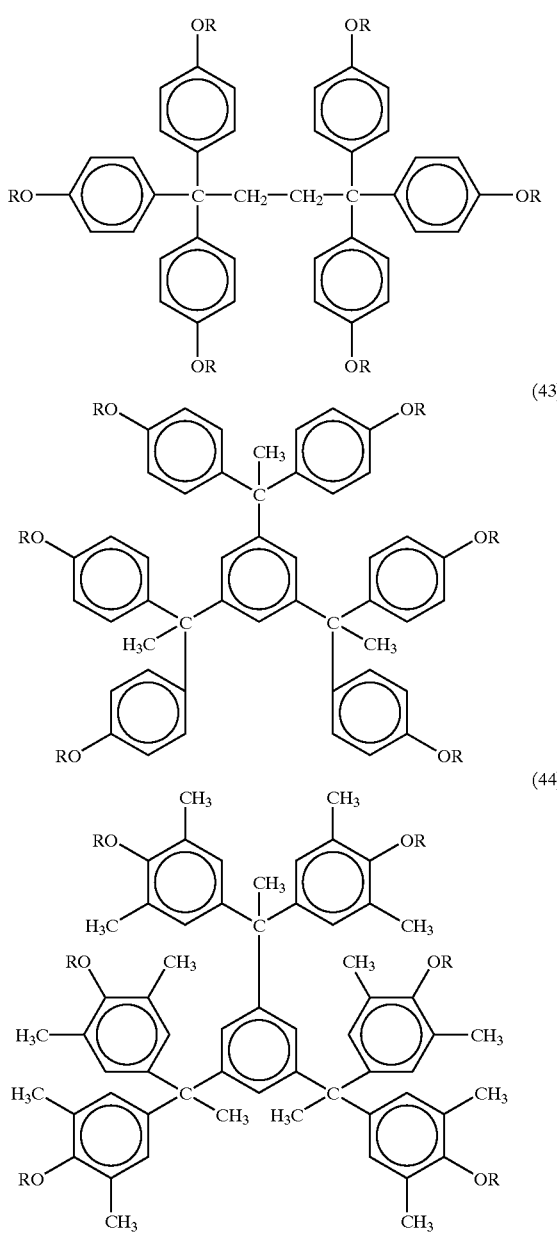

In formulae (1) to (44), R represents a hydrogen atom,

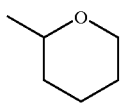

provided that at least two R groups, or three according to the structure, represent a group other than a hydrogen atom, and that each substituent R may not be the same group.

In the case of the first composition, the content of component (C) is preferably from 3 to 45 wt %, more preferably from 5 to 30 wt %, and still more preferably from 10 to 20 wt %, based on the solid content in the first composition.

In the case of the second composition, the content of component (C) is the same as in the first composition.

[4] (D) Alkali-soluble Resin (Component (D))

Alkali-soluble resin (D) is the essential component in the second composition and may be added to the first composition. Alkali-soluble resin (D) is a resin insoluble in water and soluble in an alkali developing solution, which is used for adjusting the alkali solubility of the second composition. This resin does not substantially contain an acid-decomposable group.

The examples of component (D) include novolak resin, hydrogenated novolak resin, acetone-pyrogallol resin, poly(o-hydroxystyrene), poly(m-hydroxystyrene), poly(p-hydroxystyrene), hydrogenated polyhydroxystyrene, halogen- or alkyl-substituted polyhydroxystyrene, copolymer of hydroxystyrene and N-substituted maleimide, copolymer of o/p-hydroxystyrene and m/p-hydroxystyrene, polyhydroxystyrene whose hydroxyl groups are partially O-alkylated (e.g., O-methylated, O-(1-methoxy)ethylated, O-(1-ethoxy)ethylated, O-2-tetrahydropyranylated, and O-(t-butoxycarbonyl)methylated in a proportion of from 5 to 30 mol %), or O-acylated (e.g., O-acetylated, or O-(t-butoxy)carbonylated in a proportion of from 5 to 30 mol %), styrene-maleic anhydride copolymer, styrene-hydroxystyrene copolymer, α-methylstyrene-hydroxystyrene copolymer, carboxyl group-containing methacrylate resin and derivatives thereof, and polyvinyl alcohol derivatives. However, these examples should not be construed as limiting the scope of the present invention.

Particularly preferred alkali-soluble resin (D) are novolak resin, poly(o-hydroxystyrene), poly(m-hydroxystyrene), poly(p-hydroxystyrene), and copolymers of them, alkyl-substituted polyhydroxystyrene, partially O-alkylated or O-acylatedpolyhydroxystyrene, styrene-hydroxystyrene copolymer, and α-methylstyrene-hydroxystyrene copolymer. The novolak resin can be obtained by subjecting the prescribed monomers as main components and aldehyde to addition condensation in the presence of an acid catalyst.

The preferred weight average molecular weight of the novolak resin is from 1,000 to 30,000. When the weight average molecular weight is less than 1,000, great film thickness loss is caused in the unexposed area by development, while when the weight average molecular weight exceeds 30,000, the developing speed is reduced. The especially preferred range is from 2,000 to 20,000.

Further, the weight average molecular weight of resins other than novolak resin, such as the above-described polyhydroxystyrene, derivatives thereof, and copolymers thereof is 2,000 or more, preferably from 5,000 to 200,000, and more preferably from 8,000 to 10,000, in view of improving a heat resistance of the resist film.

The weight average molecular weight used herein is defined as the value measured by gel permeation chromatography and calculated in terms of polystyrene.

In the present invention, alkali-soluble resins may be used in combination of two or more.

The use amount of the alkali-soluble resins is preferably from 40 to 97 wt %, more preferably from 60 to 90 wt %, based on the solid content in the second composition.

[5] Other Components

The positive radiation-sensitive composition according to the present invention can contain other components, if necessary. Of other components, particularly preferred components are described below.

(E) Organic Basic Compound (Component (E))

Preferred organic basic compound (E) which can be added to the positive radiation-sensitive composition according to the present invention is a compound having stronger basicity than a phenol. Organic basic compounds containing the structures represented by the following formulae (A) to (E) are preferably used. Fluctuation of performances due to aging from irradiation to post-heating is reduced by using organic basic compounds.

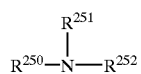

(A)

wherein $R^{250}$, $R^{251}$ and $R^{252}$, which may be the same or different, each represents a hydrogen atom, an alkyl group having from 1 to 20 carbon atoms, an aminoalkyl group having from 1 to 20 carbon atoms, a hydroxyalkyl group having from 1 to 20 carbon atoms, or a substituted or unsubstituted aryl group having from 6 to 20 carbon atoms, and $R^{251}$ and $R^{252}$ may be bonded to each other to form a ring.

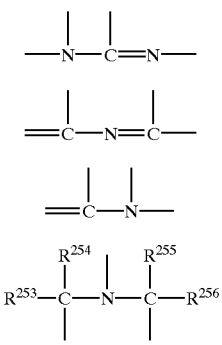

wherein $R^{253}$, $R^{254}$, $R^{255}$ and $R^{256}$, which may be the same or different, each represents an alkyl group having from 1 to 6 carbon atoms.

The preferred specific examples of such compounds include substituted or unsubstituted guanidine, substituted or unsubstituted aminopyridine, substituted or unsubstituted aminoalkylpyridine, substituted or unsubstituted aminopyrrolidine, substituted or unsubstituted indazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholine, e.g., mono-, di-, trialkylamine, substituted or unsubstituted aniline, substituted or unsubstituted piperidine, mono- or di-ethanolamine, an onium hydroxide compound, an onium caroxylate compound and a diazabicyclo compound (preferably a compound containing an onium hydroxide structure, an onium carboxylate structure, a diazabicyclo structure, an imidazol structure, a trialkylamine structure or an aniline structure) can be exemplified. The examples of the preferred substituents include an amino group, an aminoalkyl group, an alkylamino group, an aminoaryl group, an arylamino group, an alkyl group, an alkoxyl group, an acyl group, an acyloxy group, an aryl group, an aryloxy group, a nitro group, a hydroxyl group and a cyano group.

The examples of preferred basic compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethyl-aminopyridine, 2-(aminomethyl)pyridine, 2-amino-3-methyl-pyridine, 2-amino-4-methylpyridine, 2-amino-5-methylpyridine, 2-amino-6-methylpyridine, 3-aminoethylpyridine, 4-aminoethyl-pyridine, 3-aminopyrrolidine, piperazine, N-(2-aminoethyl)-piperazine, N-(2-aminoethyl)piperidine, 4-amino-2,2,6,6-tetramethylpiperidine, 4-piperidinopiperidine, 2-iminopiperidine, 1-(2-aminoethyl) pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diamonopyrimidine, 4,6-dihydroxypyrimidine, 2-pyrazoline, 3-pyrazoline, N-aminomorpholine, N-(2-aminoethyl)morpholine, 1,5-diazabicyclo[4.3.0]nona-5-ene, 1,8-diazabicyclo[5.4.0]-undeca-7-ene, 2,4,5-triphenylimidazole, tri(n-butyl)amine, tri(n-octyl)amine, N-phenyldiethanolamine, N-hydroxyethyl-piperidine, 2,6-diisopropylaniline, N-cyclohexyl-N'-morpholinoethylthiourea, and N-hydroxyethylmorpholine, but the present invention is not limited thereto.

Of these, particularly preferred compounds are 1,5-diazabicyclo[4.3.0]nona-5-ene, 1,8-diazabicyclo[5.4.0] undeca-7-ene, 2,4,5-triphenylimidazole, tri(n-butyl)amine, tri(n-octyl)amine, N-phenyldiethanolamine, N-hydroxyethylpiperidine, 2,6-diisopropylaniline, N-cyclohexyl-N'-morpholinoethylthiourea, N-hydroxyethylmorpholine, tetrabutyl ammonium hydroxide, dicyclohexylmethylamine and tris (methoxyethoxyethyl)amine.

These organic basic compounds may be used alone or in combination of two or more.

The addition amount of the organic basic compound is generally from 0.001 to 10 wt %, preferably from 0.01 to 5 wt %, based on the solid content in the composition. If the content is less than 0.001 wt %, the effect of the addition of the organic basic compound cannot be obtained. On the other hand, if it exceeds 10 wt %, the sensitivity lowers and the developing property of the non-irradiated area is liable to be deteriorated.

(F) Fluorine—and/or Silicon-Based Surfactant (Component (F))

The positive radiation-sensitive composition in the present invention preferably contains component (F).

Component (F) is at least one surfactant of a fluorine-based surfactant, a silicon-based surfactant, and a surfactant containing both a fluorine atom and a silicon atom.

When the positive radiation-sensitive composition of the present invention contains component (F), a resist pattern excellent in sensitivity, resolution, adhesion property to a substrate, dry etching resistance, less in particle generation after storage, and free of development defect and scum can be obtained with the exposure light sources of 250 nm or less, in particular 220 nm or less.

Surfactants disclosed in JP-A-62-36663, JP-A-61-226746, JP-A-61-226745, JP-A-62-170950, JP-A-63-34540, JP-A-7-230165, JP-A-8-62834, JP-A-9-54432, and JP-A-9-5988 can be used as component (F). The following commercially available surfactants can also be used as they are.

As the commercially available surfactants which can be used in the present invention, fluorine-based surfactants and silicon-based surfactants, e.g., Eftop EF301 and EF303 (manufactured by Shin-Akita Chemical Co., Ltd.), Florad FC430 and FC431 (manufactured by Sumitomo 3M Co., Limited), Megafac F171, F173, F176, F189 and R08 (manufactured by Dainippon Chemicals and Ink, Co., Ltd.), Sarfron S-382, SC101, SC102, SC103, SC104, SC105 and SC106 (manufactured by Asahi Glass Co., Ltd.), and Troysol S-366 (manufactured by Troy Chemical Inc.) can be exemplified. Polysiloxane polymer KP-341 (manufactured by Shin-Etsu Chemical Co., Ltd.) can also be used as the silicon-based surfactant.

The proportion of surfactants (F) is generally from 0.001 to 2 wt % based on the solid content in the composition, preferably from 0.01 to 1 wt %.

They can be used alone or in combination of two or more.

The positive radiation-sensitive composition according to the present invention can further contain, if necessary, dyes, pigments, plasticizers, surfactants other than the above, photosensitizers, and compounds having two or more phenolic OH groups which accelerate solubility in a developing solution.

The compounds having two or more phenolic OH groups which can be used in the present invention are phenolic compounds preferably having a molecular weight of 1,000 or less. It is necessary for these compounds to have at least two phenolic hydroxyl groups in the molecule, but when the number of the phenolic hydroxyl groups exceeds 10, improving effect of development latitude is lost. Further, if the ratio of the phenolic hydroxyl groups to the aromatic ring is less than 0.5, the dependency on the film thickness becomes large and development latitude is liable to be narrow. When this ratio exceeds 1.4, the stability of the composition is reduced, and high resolving power and excellent film thickness dependency are obtained with difficulty.

The preferred addition amount of the phenol compound is preferably from 2 to 50 wt %, more preferably from 5 to 30 wt %, based on the weight of the alkali-soluble resin. When the proportion of the phenol compound exceeds 50 wt %, development residue becomes noticeable and a new drawback of pattern deformation disadvantageously occurs during development.

Such a phenol compound having a molecular weight of 1,000 or less can be easily produced with referring to the methods disclosed, e.g., in JP-A-4-122938, JP-A-2-28531, U.S. Pat. No. 4,916,210, and EP 219294.

The specific examples of phenol compounds are shown below but the present invention is not limited thereto.

That is, the examples thereof include resorcinol, phloroglucinol, 2,3,4-trihydroxybenzophenone, 2,3,4,4'-tetrahydroxybenzophenone, 2,3,4,3',4',5'-hexahydroxybenzophenone, acetone-pyrogallol condensed resin, phloroglucocide, 2,4,2',4'-biphenyltetrol, 4,4'-thiobis (1,3-dihydroxy)benzene, 2,2',4,4'-tetrahydroxy-diphenyl ether, 2,2',4,4'-tetrahydroxydiphenyl sulfoxide, 2,2',4,4'-tetrahydroxydiphenyl sulfone, tris(4-hydroxy-phenyl) methane, 1,1-bis(4-hydroxyphenyl)cyclohexane, 4,4-(α-methylbenzylidene)bisphenol, α,α',α"-tris(4-hydroxyphenyl)-1,3,5-triisopropylbenzene, α,α',α"-tris(4-hydroxyphenyl)-1-ethyl-4-isopropylbenzene, 1,2,2-tris (hydroxyphenyl)propane, 1,1,2-tris(3,5-dimethyl-4-hydroxyphenyl)propane, 2,2,5,5-tetrakis(4-hydroxyphenyl) hexane, 1,2-tetrakis(4-hydroxyphenyl)ethane, 1,1,3-tris (hydroxyphenyl)butane, and p-[α,α,α',α'-tetrakis(4-hydroxyphenyl)]xylene.

Preparation and Usage of Positive Radiation-sensitive Composition

Each component to be contained in the positive radiation-sensitive composition according to the present invention has been described above. In the next place, the preparation and usage of the positive radiation-sensitive composition are described.

Each component of the composition of the present invention is dissolved in a solvent to prepare a coating solution and coated on a substrate. The examples of the solvents preferably used in the present invention include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycolmonomethyl ether acetate, toluene, ethyl acetate, methyl lactate, ethyl lactate, methylmethoxy propionate, ethylethoxy propionate, methylpyruvate, ethyl pyruvate, propyl pyruvate, N,N-dimethylformamide, dimethyl sulfoxide, N-methylpyrrolidone, and tetrahydrofuran. These solvents can be used alone or in combination.

Of the above solvents, 2-heptanone, γ-butyrolactone, ethylene glycol monomethyl ether, ethylene glycol monoethyl ether, ethylene glycol monoethyl ether acetate, propylene glycol monomethyl ether, propylene glycol monomethyl ether acetate, methyl lactate, ethyl lactate, methylmethoxy propionate, ethylethoxypropionate, N-methylpyrrolidone, and tetrahydrofuran are preferably used.

In the present invention, an organic solvent may be used either alone or as a mixture thereof. Particularly, a mixed solvent which is mixed with a solvent containing a hydroxyl group in the structure thereof and a solvent containing no hydroxyl group in the structure thereof, is preferably used in view of reducing generation of particle upon storage of the resist solution.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether and ethyl lactate. Among these, propylene glycol monomethyl ether and ethyl lactate are particularly preferred.

Examples of the solvent containing no hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetoamide, and dimethylsulfoxide. Among these, propylene glycol monomethyl ether acetate, ethyl ethoxypropionate, 2-heptanone, γ-butyrolactone, cyclohexanone, and butyl acetate are more preferred, and propylene glycol monomethyl ether acetate, ethyl ethoxypropionate, and 2-heptanone are most preferred.

The mixing ratio (weight ratio) of the solvent containing a hydroxyl group/the solvent containing no hydroxyl group is generally 1/99 to 99/1, preferably 10/90 to 90/10, more preferably 20/80 to 60/40.

Also, in view of the coating uniformity, the mixed solvent containing 50 wt % or more of the solvent containing no hydroxyl group is particularly preferred.

The mixture of propylene glycol monomethyl ether acetate/propylene glycol monomethyl ether (mixing ratio: 90/10 to 50/50) is most preferred as the mixed solvent.

It is preferred to add fluorine—and/or silicon-based surfactant (F) to the above solvents.

Surfactants other component (F) can also be used. The specific examples of other surfactants which can be used in the present invention include nonionic surfactants such as polyoxyethylene alkyl ethers (e.g., polyoxyethylene lauryl ether, polyoxyethylene stearyl ether, polyoxyethylene cetyl ether, and polyoxyethylene oleyl ether), polyoxyethylene alkylaryl ethers (e.g., polyoxyethylene octylphenol ether, and polyoxyethylene nonylphenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, and sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate), and acrylic acid or methacrylic acid (co)polymers Polyflow No. 75, No. 95 (Kyoei-Sha Oils and Fats Chemical Industries Co., Ltd.).

The proportion of these other surfactants is generally 2 wt % or less, preferably 1 wt % or less, based on the solid content in the composition.

After coating the above composition on a substrate as used in the production of precise integrated circuit elements (e.g., a silicon/silicon dioxide-coated substrate, SiON, TiN, SOG) by an appropriate coating method such as a spinner or a coater, the coated substrate is subjected to irradiation through a predetermined mask, baking and then development, thereby a good resist pattern can be obtained.

In the case where the exposure light source is DUV light, it is preferred to coat a coating solution on a substrate provided with a reflection-preventing film, by which standing wave is reduced and resolution is improved. DUV series (manufactured by Brewer Science Co., Ltd.) and AR series (manufactured by Shipley Co.) are preferably used as the reflection-preventing films.

Developing solutions such as alkaline aqueous solutions of inorganic alkalis, e.g., sodium hydroxide, potassium hydroxide, sodium carbonate, sodium silicate, sodium metasilicate, and aqueous ammonia; primary amines, e.g., ethylamine and n-propylamine; secondary amines, e.g., diethylamine and di-n-butylamine; tertiary amines, e.g., triethylamine and methyldiethylamine; alcohol amines, e.g., dimethylethanolamine and triethanolamine; quaternary ammonium salts, e.g., tetramethylammonium hydroxide and tetraethylammonium hydroxide; and cyclic amines, e.g., pyrrole and piperidine, can be used for the positive radiation-sensitive composition of the present invention.

The above alkaline aqueous solutions can further contain appropriate amounts of alcohols and surfactants.

EXAMPLE

The present invention is explained in further detail with reference to the following examples, but the present invention should not be construed as being limited thereto.

Synthesis Example 1

Synthesis of IA-1 (Acid-generating Component (A))

Tetralone (10 g) was dissolved in 100 ml of N,N-dimethylformamide under nitrogen gas flow, and 50 ml of triethylamine was added to the solution. Chlorotrimethylsilane (14.9 g) was gradually added to the solution, and the mixture was allowed to react at 120° C. for 2 hours. After the reaction solution was cooled to room temperature, 200 ml of hexane was added thereto, the reaction solution was washed with a solution of saturated sodium hydrogencarbonate two times, dried and concentrated. The crude product was refined by distillation under reduced pressure, thereby 13 g of enol silyl ether of tetralone was obtained.

Under nitrogen gas flow, 5 g of the enol silyl ether of tetralone and 2.4 g of tetramethylene sulfoxide were dissolved in 50 ml of chloroform, and the solution was cooled to −10° C. To the solution was added 4.8 g of trifluoroacetic anhydride over 30 minutes, and the solution was allowed to react for 30 minutes. An aqueous solution of 7.7 g of potassium nonafluorobutanesulfonate was added to the reaction solution, after stirring the reaction solution thoroughly, a chloroform phase was separated, and a water phase was extracted with chloroform. The chloroform phase was concentrated, thereby a crude product was obtained. This product was washed with diisopropyl ether, thereby 4.2 g of exemplified compound IA-1 was obtained.

Compounds IA-2 to IA-48 were synthesized in the same manner.

Synthesis Example 2

Synthesis of IB-1

Aluminum chloride (22.7 g) was dissolved in 100 ml of carbon tetrachloride, and 10 g of thioanisole and 20 g of chloroacetic acid chloride were dropwise added to the solution with ice cooling. The mixed solution was subjected to reaction with refluxing for 2 hours. The reaction solution was poured into ice, 15 ml of concentrated hydrochloric acid was added thereto and the reaction solution was stirred for 30 minutes. A water phase was taken out and an aqueous solution containing 24.5 g of potassium nonafluorobutanesulfonate was added to the reaction solution, thereby powder was precipitated. The precipitate was filtered and recrystallized from ethyl acetate/acetone, thereby 12.6 g of exemplified compound IB-1 was obtained.

Compounds IB-2 to IB-24 were synthesized in the same manner.

Synthesis Example 3

Syntheses of Resin (Component (B))
(1) Synthesis of p-[1-(cyclohexylethoxy)ethoxy]styrene/p-hydroxystyrene (30/70) (resin A-25)

p-Hydroxystyrene (70 g) (VP-8000, manufactured by Nippon Soda Co., Ltd.) was dissolved in 320 g of propylene glycol monomethyl ether acetate (PGMEA) by heating, after dehydration by distillation under reduced pressure, the solution was cooled to 20° C. To the solution were added 0.35 g of pyridinium p-toluenesulfonate and 22.4 g of cyclohexane ethanol. t-Butyl vinyl ether (17.5 g) was gradually added to the solution to perform reaction at 20° C. for 5 hours. To the reaction solution were added 0.28 g of triethylamine and 320 ml of ethyl acetate, and the reaction solution was washed with 150 ml of distilled water three times. The solvent was distilled off and the solution was concentrated. The thus-obtained oil was dissolved in 100 ml of acetone, and the solution was gradually poured into 2 liters of distilled water. The precipitated powder was filtered and dried, thereby 54 g of resin A-25 was obtained.

(2) Synthesis of p-[1-(cyclohexylethoxy)ethoxy]styrene/p-acetoxystyrene/p-hydroxystyrene (30/10/60) (resin A-38)

p-Hydroxystyrene (70 g) (VP-8000, manufactured by Nippon Soda Co., Ltd.) was dissolved in 320 g of propylene glycol monomethyl ether acetate (PGMEA) by heating, after dehydration by distillation under reduced pressure, the solution was cooled to 20° C. To the solution were added 0.35 g of pyridinium p-toluenesulfonate and 22.4 g of cyclohexane ethanol. t-Butyl vinyl ether (17.5 g) was gradually added to the solution to perform reaction at 20° C. for 5 hours. To the reaction solution were added 5.53 g of pyridine, and then 5.9 g of acetic anhydride was gradually added. The solution was subjected to reaction at room temperature for 1 hour. Ethyl acetate (320 ml) was added to the solution, and the reaction solution was washed with 150 ml of distilled water three times. The solvent was distilled off and the solution was concentrated. The thus-obtained oil was dissolved in 100 ml of acetone, and the solution was gradually poured into 2 liters of distilled water. The precipitated powder was filtered and dried, thereby 58 g of resin A-38 was obtained.

(3) The Following Resins were Synthesized in the Same Manner as in the Above (1) and (2)

A-1: p-Tetrahydropyranyloxystyrene/p-hydroxystyrene (30/70), molecular weight: 13,000, degree of dispersion (Mw/Mn): 1.2

A-3: p-(1-Ethoxyethoxy)styrene/p-hydroxystyrene (35/65), molecular weight: 15,000, degree of dispersion (Mw/Mn): 1.1

A-7: p-(1-Isobutoxyethoxy)styrene/p-hydroxystyrene (30/70), molecular weight: 6,000, degree of dispersion (Mw/Mn): 1.2

A-15: p-(1-1-Butoxyethoxy)styrene/p-hydroxystyrene/repeating unit having a crosslinking structure (25/74/1), molecular weight: 100,000, degree of dispersion (Mw/Mn): 2.5

A-36: p-(1-Phenethyloxyethoxy)styrene/p-acetoxystyrene/p-hydrox-styrene (30/10/60), molecular weight: 11,000, degree of dispersion (Mw/Mn): 1.2

A-41: p-[1-(4-t-Butylcyclohexylcarboxyethoxy)ethoxy]styrene/p-acetoxystyrene/p-hydroxystyrene (30/10/60), molecular weight: 12,000, degree of dispersion (Mw/Mn): 1.1

A-43: p-[1-(Cyclohexylethoxy)ethoxy]styrene/p-t-butylstyrene/p-hydroxystyrene (30/8/62), molecular weight: 18,000, degree of dispersion (Mw/Mn): 2.3

A-22: p-(1-Benzyloxyethoxy)styrene/p-hydroxystyrene (25/75), molecular weight: 13,000, degree of dispersion (Mw/Mn): 1.3

A-35: p-(1-Benzyloxyethoxy)styrene/p-hydroxystyrene/p-acetoxystyrene (20/70/10), molecular weight: 9,000, degree of dispersion (Mw/Mn): 1.2

Further, the following resin of component (B) was synthesized.

(4) Synthesis of p-Hydroxystyrene/t-butyl Acrylate (79/21) (A-48)

p-Vinylphenol (84.1 g) and 22.4 g of t-butyl acrylate were dissolved in 150 g of dioxane, and a nitrogen gas was introduced for 1 hour.

2,2'-Azobisisodimethyl butyrate (6.91 g) was added to the above reaction solution, and the mixed solution was heated at 75° C. under nitrogen gas flow and polymerization was performed for 12 hours. After completion of the polymerization reaction, the reaction solution was cooled to room temperature, and 150 g of acetone was added to dilute the reaction solution. The diluted reaction solution was dripped into a large amount of hexane, thereby a solid polymer was obtained. Dilution with acetone and dripping into hexane were repeated three times respectively to remove the residual monomer.

The obtained polymer was dried at 60° C. under reduced pressure, thus polymer A-48 was obtained.

The composition ratio of p-vinylphenol/t-butyl acrylate was 79/21 from NMR analysis.

Mw was 12,000 and the degree of dispersion (Mw/Mn) was 2.6.

(5) Synthesis of p-(1-isobutoxyethoxy)styrene/p-hydroxystyrene/t-butyl Acrylate (20/59/21) (A-16)

The above polymer (A-48) (20 g) was dissolved in 80 g of propylene glycol monoethyl ether acetate (PGMEA) and the solution was heated at 60° C., and then the pressure was gradually reduced until 20 mmHg, thereby PGMEA and the moisture in the reaction system were azeotropically hydrated. After the azeotropic hydration, the temperature was lowered to 20° C., 2.2 g of isobutyl vinyl ether was added thereto, and further 3 mg of p-toluenesulfonic acid was added. After the addition, reaction was performed for 2 hours, and a small amount of triethylamine was added to neutralize the acid. Thereafter, ethyl acetate was added to the reaction solution, and the salt was removed by washing with ion exchange water. Further, ethyl acetate and water were distilled off under reduced pressure, thereby polymer A-16 was obtained.

(6) p-Hydroxystyrene/styrene/t-butyl Acrylate (78/7/15) (molecular weight: 13,100, the degree of dispersion (Mw/Mn): 2.7) (A-51) was synthesized in the same manner as in the synthesis of the above resin A-48.

(7) Synthesis of p-hydroxystyrene/p-(t-butoxycarbonyloxy)-styrene (60/40) (A-49)

Poly (p-hydroxystyrene) (VP-8000, manufactured by Nippon Soda Co., Ltd., weight average molecular weight: 11,000) was dissolved in 40 ml of pyridine, and 1.28 g of di-t-butyl dicarbonate was added to the solution with stirring at room temperature. After performing the reaction at room temperature for 3 hours, the reaction solution was poured into 1 liter of ion exchange water containing 20 g of concentrated hydrochloric acid. The powder precipitated was filtered, washed with water, and dried, thereby p-hydroxystyrene/p-(t-butyloxycarbonyloxy)styrene copolymer (60/40) was obtained.

Examples 1 to 30

Comparative Example 1

Each component was dissolved in a solvent as shown in Tables 1 and 2 in a solid content concentration of 15 wt %, and the obtained solution was filtered through a polyethylene filter having a pore diameter of 0.1 µm to prepare a resist solution. Each of the resist solutions was evaluated as shown below.

A. Evaluation of KrF Excimer Laser Irradiation

DUV 42 (manufactured by Brewer Science Co., Ltd.) was coated on silicon wafer having been treated with hexamethyl-disilazane, and the coated layer was heated at 215° C. for 60 seconds, thereby a reflection-preventing film having a thickness of 550 Å was formed.

The above prepared resist solution was uniformly coated on the above film with a spin coater, dried by heating on a hot plate at 120° C. for 90 seconds, thus a resist film having a thickness of 0.6 µm was formed. A pattern irradiation was performed on the resist film through a mask for line-and-space using a KrF excimer laser stepper (NA=0.63), and the resist film was subjected to heating on a hot plate at 110° for 90 seconds immediately after irradiation. Further, the resist film was subjected to development with a 2.38% aqueous solution of tetramethylammonium hydroxide at 23° C. for 60 seconds, to rinsing with pure water for 30 seconds and drying.

Performances of each resist were evaluated by the following methods with the thus-obtained pattern on the silicon wafer. The results obtained are shown in Table 3 below.

Evaluation of Sensitivity

Sensitivity was evaluated by the quantity of irradiation (mJ/cm$^2$) required to reproduce the line-and-space pattern of 0.20 µm.

Resolution

Resolution is critical resolution by the quantity of irradiation to reproduce the mask pattern of line-and-space of 0.18 µm (1/1).

TABLE 1

| Example No. | Component (A) Acid-Generating Agent of the Invention (g) | Other Acid-Generating Agent (g) | Component (B) (g) | Component (C) (g) | Component (E) Basic Compound (g) | Component (F) Surfactant (0.02 g) | Solvent |
|---|---|---|---|---|---|---|---|
| Example 1 | IA-1 (0.3) | — | A-25 (10) | — | (1)(0.05) | W-2 | PGMEA/PGME (8/2) |
| Example 2 | IA-2 (0.2) | — | A-38 (10) | — | (1)(0.05) | W-2 | PGMEA/PGME (8/2) |
| Example 3 | IA-3 (0.4) | — | A-36 (10) | — | (2)(0.02) | W-2 | PGMEA |
| Example 4 | IA-4 (0.3) | — | A-43 (10) | — | (2)(0.02) | W-4 | PGMEA |
| Example 5 | IA-6 (0.4) | PAG4-19 (0.1) | A-35 (10) | — | (3)(0.05) | W-4 | EL/EEP |
| Example 6 | IA-8 (0.2) | PAG4-33 (0.1) | A-22 (10) | — | (3)(0.01) | W-4 | BL |
| Example 7 | IA-9 (0.4) | PAG6-2 (0.2) | A-38 (5) A-3 (4) | D-2 (1) | (1)(0.02) | W-4 | CH |
| Example 8 | IA-15 (0.3) | PAG4-36 (0.1) | A-25 (5) A-51 (4) | — | (4)(0.01) | W-2 | PGMEA/PGME (8/2) |
| Example 9 | IA-28 (0.3) | PAG4-38 (0.2) | A-38 (10) | B'-1 (0.1) | (2)(0.005) | W-1 | PGMEA |
| Example 10 | IA-29 (0.3) | PAG4-37 (0.05) | A-38 (10) | — | (4)(0.05) | W-4 | PGMEA/PGME (8/2) |
| Example 11 | IA-31 (0.4) | PAG7-3 (0.5) | A-3 (10) | — | (5)(0.02) | W-3 | PGMEA |
| Example 12 | IA-32 (0.2) | PAG7-5 (0.6) | A-51 (5) A-3 (5) | — | (1)(0.02) | W-2 | PGMEA/PGME (8/2) |
| Example 13 | IA-35 (0.2) | PAG5-2 (0.1) | A-3 (2) A-49 (6.5) | D-2 (1.5) | (5)(0.01) | W-1 | PGMEA/PGME (8/2) |
| Example 14 | IA-36 (0.3) | PAG3-16 (0.1) | A-3 (8) A-48 (1) A-49 (1) | B'-3 (0.1) | (1)(0.01) (5)(0.01) | W-4 | PGMEA/PGME (8/2) |
| Example 15 | IA-32 (0.3) | PAG4-32 (0.1) | A-15 (10) | — | (4)(0.05) | W-2 | PGMEA/PGME (8/2) |
| Example 16 | IA-33 (0.4) IA-36 (0.03) | — | A-1 (10) | — | (2)(0.02) | W-4 | EL/EEP |
| Example 17 | IA-30 (0.2) | PAG3-22 (0.2) | A-48 (5) A-49 (5) | — | (4)(0.02) | W-4 | PGMEA/PGME (8/2) |
| Example 18 | IA-16 (0.2) | PAG4-4 (0.1) | A-48 (5) | — | (5)(0.02) | W-2 | PGMEA |
| Example 19 | IA-23 (0.2) | PAG4-38 (0.2) | A-51 (10) | — | (1)(0.01) | W-3 | PGMEA/PGME (8/2) |
| Example 20 | IA-40 (0.3) | — | A-49 (10) | — | (5)(0.02) | W-1 | PGMEA |
| Example 21 | IA-42 (0.3) | — | A-48 (5) A-49 (5) | — | (4)(0.02) | W-4 | PGMEA/PGME (8/2) |
| Example 22 | IB-1 (0.4) | — | A-48 (10) | — | (5)(0.02) | W-2 | PGMEA |
| Example 23 | IB-13 (0.3) | — | A-51 (10) | — | (1)(0.01) | W-3 | PGMEA/PGME (8/2) |
| Example 24 | IB-15 (0.3) | PAG4-3 (0.1) | A-49 (10) | — | (5)(0.02) | W-1 | PGMEA |
| Comp. Ex. 1 | PAG-A (0.3) | — | A-25 (10) | — | (1)(0.05) | W-2 | PGMEA/PGME (8/2) |

TABLE 2

| Example No. | Component (A) Acid-Generating Agent of the Invention (g) | Other Acid-Generating Agent (g) | Component (D) (g) | Component (C) (g) | Component (E) Basic Compound (g) | Component (F) Surfactant (0.02 g) | Solvent |
|---|---|---|---|---|---|---|---|
| Example 25 | IA-1 (0.3) IA-34 (0.02) | PAG4-4 (0.2) | p-PHS (8) | D-1 (2) B'-2 (0.2) | (1) (0.01) (5) (0.02) | W-2 | PGMEA/PGME (8/2) |
| Example 26 | IA-33 (0.4) | PAG4-5 (0.1) | p-PHS/St (9) | D-2 (1) | (1) (0.01) (2) (0.02) | W-4 | PGMEA |
| Example 27 | IA-16 (0.4) | PAG4-17 (0.2) | m-PHS (8) | D-3 (1.5) | (1) (0.02) | W-3 | EL/EEP |
| Example 28 | IA-6 (0.3) | — | p-PHS (8) | D-1 (2) B'-2 (0.2) | (1) (0.01) (5) (0.02) | W-2 | PGMEA/PGME (8/2) |
| Example 29 | IA-31 (0.3) | — | p-PHS/St (9) | D-2 (1) | (1) (0.01) (2) (0.02) | W-4 | PGMEA |
| Example 30 | IB-1 (0.4) | — | m-PHS (8) | D-3 (1.5) | (1) (0.02) | W-3 | EL/EEP |

Description of the components in Tables 1 and 2.

Acid Generating Agent

PAG3-19, 3-22, 4-3,4-4, 4-5,4-33, 4-36, 4-37, 4-38, 7-3 and 7-5 were respectively numbers of the exemplified specific compounds shown above, and commercially available products were used.

PAG-A is shown below.

PAG-A

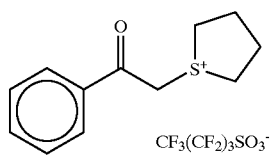

CF$_3$(CF$_2$)$_3$SO$_3^-$

Alkali-Soluble Resins (in Solid Content)

p-PHS: p-Hydroxystyrene polymer (weight average molecular weight: 13,000, degree of dispersion: 1.1), alkali-soluble m-PHS: m-Hydroxystyrene polymer (weight average molecular weight: 12,000, degree of dispersion: 1.3), alkali-soluble p-PHS/St: p-Hydroxystyrene/styrene copolymer (molar ratio: 85/15) (weight average molecular weight: 20,000, degree of dispersion: 2.9), alkali-soluble (B'-1), (B'-2) and (B'-3) are shown below.

(B'-1)

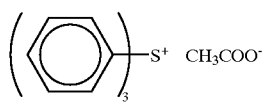

(B'-2)

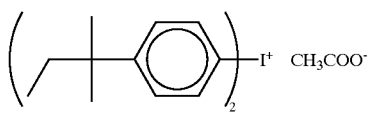

(B'-3)

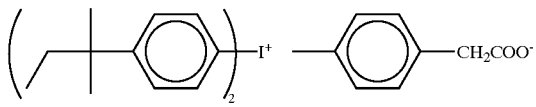

(D—1), (D—2) and (D—3) are shown below.

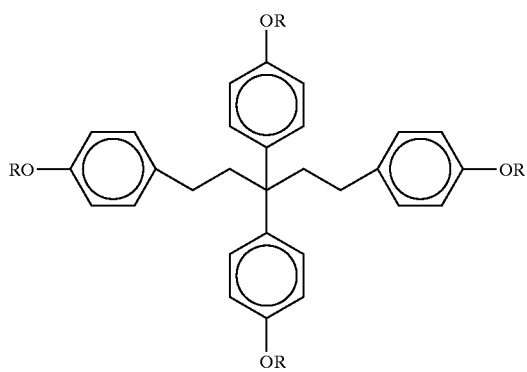

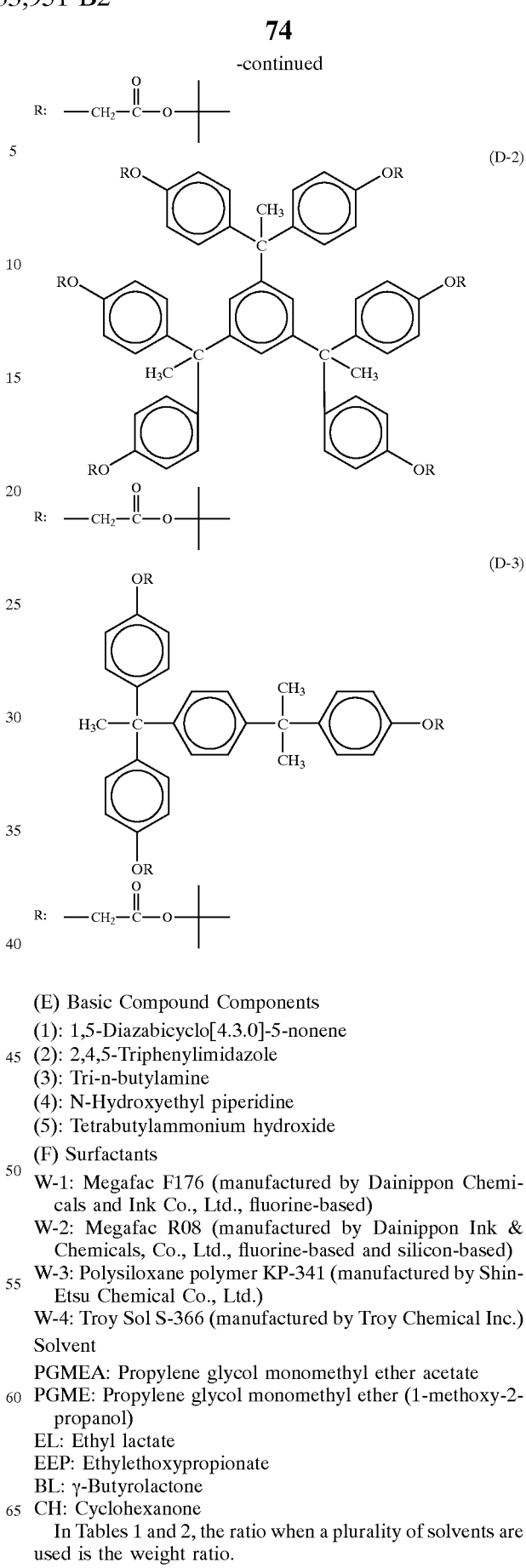

(E) Basic Compound Components
(1): 1,5-Diazabicyclo[4.3.0]-5-nonene
(2): 2,4,5-Triphenylimidazole
(3): Tri-n-butylamine
(4): N-Hydroxyethyl piperidine
(5): Tetrabutylammonium hydroxide (F) Surfactants
W-1: Megafac F176 (manufactured by Dainippon Chemicals and Ink Co., Ltd., fluorine-based)
W-2: Megafac R08 (manufactured by Dainippon Ink & Chemicals, Co., Ltd., fluorine-based and silicon-based)
W-3: Polysiloxane polymer KP-341 (manufactured by Shin-Etsu Chemical Co., Ltd.)
W-4: Troy Sol S-366 (manufactured by Troy Chemical Inc.)

Solvent

PGMEA: Propylene glycol monomethyl ether acetate
PGME: Propylene glycol monomethyl ether (1-methoxy-2-propanol)
EL: Ethyl lactate
EEP: Ethylethoxypropionate
BL: γ-Butyrolactone
CH: Cyclohexanone In Tables 1 and 2, the ratio when a plurality of solvents are used is the weight ratio.

TABLE 3

| Example No. | Sensitivity (mJ/cm$^2$) | Resolution ($\mu$m) |
| --- | --- | --- |
| Example 1 | 9 | 0.11 |
| Example 2 | 12 | 0.11 |
| Example 3 | 14 | 0.11 |
| Example 4 | 13 | 0.11 |
| Example 5 | 16 | 0.11 |
| Example 6 | 13 | 0.11 |
| Example 7 | 15 | 0.11 |
| Example 8 | 12 | 0.11 |
| Example 9 | 14 | 0.11 |
| Example 10 | 15 | 0.11 |
| Example 11 | 14 | 0.11 |
| Example 12 | 12 | 0.11 |
| Example 13 | 15 | 0.11 |
| Example 14 | 13 | 0.11 |
| Example 15 | 13 | 0.11 |
| Example 16 | 15 | 0.11 |
| Example 17 | 12 | 0.11 |
| Example 18 | 17 | 0.12 |
| Example 19 | 19 | 0.12 |
| Example 20 | 20 | 0.12 |
| Example 21 | 18 | 0.12 |
| Example 22 | 17 | 0.12 |
| Example 23 | 16 | 0.12 |
| Example 24 | 18 | 0.12 |
| Example 25 | 9 | 0.11 |
| Example 26 | 10 | 0.11 |
| Example 27 | 18 | 0.12 |
| Example 28 | 11 | 0.11 |
| Example 29 | 13 | 0.11 |
| Example 30 | 18 | 0.12 |
| Comparative Example 1 | 25 | 0.13 |

As is apparent from the results in Table 3, when each of the resist films in Examples 1 to 30, which are positive radiation-sensitive compositions of the present invention, is irradiated with a KrF laser beam, i.e., far ultraviolet ray, a pattern of high resolution and high sensitivity can be formed.

Contrary to these, the resist film in Comparative Example 1 which does not use component (A) is low in resolution and sensitivity.

B. Evaluation of Electron Beam Irradiation

The resist solutions of a part of the samples in Examples shown in Tables 1 and 2 (Examples shown in Table 4 below) were prepared in solid concentration of 14%.

To the compositions in Examples 8, 13 and 27 were further added 1 g of benzoyloxy vinyl ether (vinyloxyethyl benzoate).

Each of the thus-obtained resist solutions was uniformly coated on silicon substrate having been treated with hexamethyldisilazane, and the coated layer was dried by heating at 120° C. for 60 seconds on a hot plate, thereby a resist film having a thickness of 0.4 $\mu$m was formed. The resist film was irradiated with an electron beam projector lithography apparatus (accelerating voltage: 100 keV), and heated on a hot plate at 110° C. for 90 seconds just after irradiation. Further, the resist film was subjected to development with a 2.38 wt % aqueous solution of tetramethylammonium hydroxide at 23° C. for 60 seconds, to rinsing with pure water for 30 seconds and drying.

Performances of each resist were evaluated by the following methods with the thus-obtained pattern on the silicon wafer. The results obtained are shown in Table 4 below.

Evaluation of Sensitivity

Sensitivity was evaluated by the quantity of irradiation ($\mu$C/cm$^2$) required to reproduce the contact hole pattern of 0.15 $\mu$m.

Resolution

Resolution is critical resolution by the quantity of irradiation to reproduce the contact hole pattern of 0.15 $\mu$m.

TABLE 4

| Example No. | Sensitivity (mJ/cm$^2$) | Resolution ($\mu$m) |
| --- | --- | --- |
| Example 1 | 3 | 0.06 |
| Example 8 | 4 | 0.06 |
| Example 13 | 4 | 0.06 |
| Example 17 | 5 | 0.06 |
| Example 25 | 5 | 0.06 |
| Example 26 | 7 | 0.07 |
| Example 27 | 5 | 0.06 |
| Comparative Example 1 | 9 | 0.09 |

From the results in Table 4, it can be seen that a pattern of high sensitivity and high resolution can be formed by the composition of the present invention also by irradiation with electron beams.

Effect Of The Invention

By the positive radiation-sensitive composition according to the present invention, a pattern of high sensitivity and high resolution can be formed by shortwave exposure light sources where it is possible to perform ultra-fine process are used and lithographic technique using a positive chemically amplified resist compositions.

Further, a pattern of high sensitivity and high resolution can also be formed by the composition of the present invention even when an electron beam is used as the irradiation energy beams.

The entitle disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A positive radiation-sensitive composition comprising:
   (A) at least one compound capable of generating an acid upon irradiation with an actinic ray represented by the following formula (I); and
   (B) a resin having a group capable of decomposing by the action of an acid to increase the solubility in an alkali developing solution:

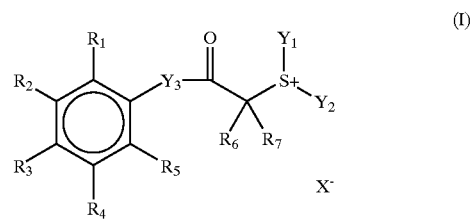

(I)

wherein $R_1$, $R_2$, $R_3$, $R_4$ and $R_5$ each represents a hydrogen atom, an alkyl group, an alkoxyl group, a nitro group, a halogen atom, an alkyloxycarbonyl group, or an aryl group, and at least two of $R_1$, $R_2$, $R_3$, $R_4$ and $R_5$ may be bonded to form a cyclic structure; $R_6$ and $R_7$ each represents a hydrogen atom, an alkyl group, a cyano group or an aryl group; $Y_1$ and $Y_2$ each represents an alkyl group, an aryl group, an aralkyl group, or an aromatic group containing a hetero atom, and $Y_1$ and $Y_2$ may be bonded to form a ring; $Y_3$ represents a single bond or a divalent linking group; and $X^-$ represents a non-nucleophilic anion; provided that at least one of $R_1$, $R_2$, $R_3$, $R_4$ and $R_5$, and at least one of $Y_1$ and $Y_2$ are bonded to form a ring, or at least one of $R_1$, $R_2$, $R_3$, $R_4$ and $R_5$, and at least one of $R_6$ and $R_7$ are bonded to form a ring; and there may be present two or more structures represented by formula (I) by being bonded at any position of $R_1$ to $R_7$ or at any position of $Y_1$ and $Y_2$ via a linking group, wherein the resin as the (B) component is a resin containing a hydroxystyrene repeating unit.

2. The positive radiation-sensitive composition as claimed in claim 1, wherein the compound (A) is represented by the following formula (IA) or (IB):

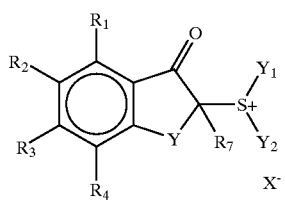

(IA)

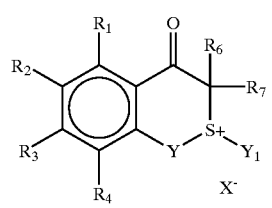

(IB)

wherein in formula (IA), $R_1$ to $R_4$, $R_7$, $Y_1$, $Y_2$ and $X-$ have the same meaning as those in formula (I), and Y represents a single bond or a divalent linking group; and in formula (IB), $R_1$ to $R_4$, $R_6$, $R_7$, $Y_1$ and $X^-$ have the same meaning as those in formula (I), and Y represents a single bond or a divalent linking group.

3. The positive radiation-sensitive composition as claimed in claim 1, which further comprises (C) a low molecular weight dissolution-inhibiting compound: having a molecular weight of 3,000 or less; containing an acid-decomposable group; and capable of increasing the solubility in an alkali developing solution by the action of an acid.

4. The positive radiation-sensitive composition as claimed in claim 1, wherein the content of said compound of component (A) is from 0.1 to 20 wt % based on the solid content in the composition.

5. The positive radiation-sensitive composition as claimed in claim 1, wherein the resin as the (B) component is a resin containing a hydroxystyrene repeating unit and a repeating unit having an acid-decomposable group.

6. The positive radiation-sensitive composition as claimed in claim 1, wherein the group capable of decomposing by the action of an acid in the resin as the (B) component is an acetal group.

7. The positive radiation-sensitive composition as claimed in claim 1, wherein the resin as the (B) component is a resin containing a repeating unit represented by formula (IV) and (V):

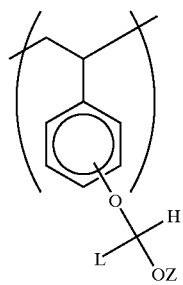

(IV)

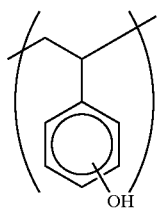

(V)

wherein, L represents a hydrogen atom, a straight chain, branched or cyclic alkyl group which may be substituted, or an aralkyl group which may be substituted; and Z represents a straight chain, branched or cyclic alkyl group which may be substituted, or an aralkyl group which may be substituted; Z and L may be bonded to form a 5- or 6-membered ring.

8. The positive radiation-sensitive composition as claimed in claim 1, which comprises (E) an organic basic compound.

9. The positive radiation-sensitive composition as claimed in claim 8, wherein the organic basic compound is a compound containing the structures represented by formulae (A) to (E):

(A)

wherein $R^{250}$, $R^{251}$ and $R^{252}$, which may be the same or different, each represents a hydrogen atom, an alkyl group having from 1 to 20 carbon atoms, an aminoalkyl group having from 1 to 20 carbon atoms, a hydroxyalkyl group having from 1 to 20 carbon atoms, or a substituted or unsubstituted aryl group having from 6 to 20 carbon atoms, and $R^{251}$ and $R^{252}$ may be bonded to each other to form a ring;

(B)

(C)

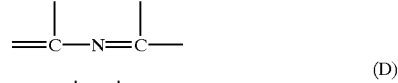

(D)

(E)

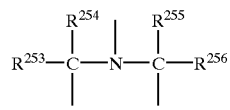

wherein $R^{253}$, $R^{254}$, $R^{255}$ and $R^{256}$, which may be the same or different, each represents an alkyl group having from 1 to 6 carbon atoms.

10. The positive radiation-sensitive composition as claimed in claim 9, wherein the organic basic compound is a compound containing at least one selected from the group consisting of an onium hydroxide structure, an onium carboxylate structure, a diazabicyclo structure, an imidazol structure, a trialkylamine structure and an aniline structure.

11. A positive radiation-sensitive composition comprising:
(A) at least one compound capable of generating an acid upon irradiation with an actinic ray represented by the following formula (I);
(C) a low molecular weight dissolution-inhibiting compound: having a molecular weight of 3,000 or less; containing an acid-decomposable group; and capable of increasing the solubility in an alkali developing solution by the action of an acid; and
(D) a resin insoluble in water and soluble in an alkali developing solution:

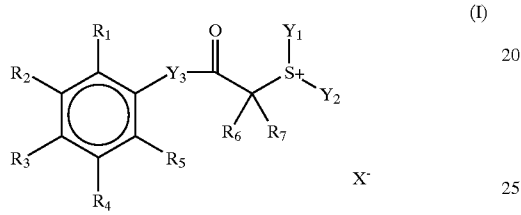

(I)

wherein $R_1$, $R_2$, $R_3$, $R_4$ and $R_5$ each represents a hydrogen atom, an alkyl group, an alkoxyl group, a nitro group, a halogen atom, an alkyloxycarbonyl group, or an aryl group, and at least two of $R_1$, $R_2$, $R_3$, $R_4$ and $R_5$ may be bonded to form a cyclic structure; $R_6$ and $R_7$ each represents a hydrogen atom, an alkyl group, a cyano group or an aryl group; $Y_1$ and $Y_2$ each represents an alkyl group, an aryl group, an aralkyl group, or an aromatic group containing a hetero atom, and $Y_1$ and $Y_2$ may be bonded to form a ring; $Y_3$ represents a single bond or a divalent linking group; and $X^-$ represents a non-nucleophilic anion; provided that at least one of $R_1$, $R_2$, $R_3$, $R_4$ and $R_5$, and at least one of $Y_1$ and $Y_2$ are bonded to form a ring, or at least one of $R_1$, $R_2$, $R_3$, $R_4$ and $R_5$, and at least one of $R_6$ and $R_7$ are bonded to form a ring; and there may be present two or more structures represented by formula (I) by being bonded at any position of $R_1$ to $R_7$ or at any position of $Y_1$ and $Y_2$ via a linking group.

12. A positive radiation-sensitive composition comprising:
(A) at least one compound capable of generating an acid upon irradiation with an actinic ray represented by the following formula (I); and
(B) a resin having a group capable of decomposing by the action of an acid to increase the solubility in an alkali developing solution:

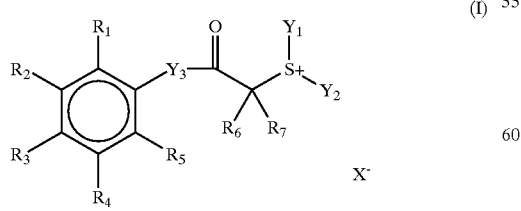

(I)

wherein $R_1$, $R_2$, $R_3$, $R_4$ and $R_5$ each represents a hydrogen atom, an alkyl group, an alkoxyl group, a nitro group, a halogen atom, an alkyloxycarbonyl group, or an aryl group, and at least two of $R_1$, $R_2$, $R_3$, $R_4$ and $R_5$ may be bonded to form a cyclic structure; $R_6$ and $R_7$ each represents a hydrogen atom, an alkyl group, a cyano group or an aryl group; $Y_1$ and $Y_2$ each represents an alkyl group, an aryl group, an aralkyl group, or an aromatic group containing a hetero atom, and $Y_1$ and $Y_2$ may be bonded to form a ring; $Y_3$ represents a single bond or a divalent linking group; and $X^-$ represents a non-nucleophilic anion; provided that at least one of $R_1$, $R_2$, $R_3$, $R_4$ and $R_5$, and at least one of $Y_1$ and $Y_2$ are bonded to form a ring, or at least one of $R_1$, $R_2$, $R_3$, $R_4$ and $R_5$, and at least one of $R_6$ and $R_7$ are bonded to form a ring; and there may be present two or more structures represented by formula (I) by being bonded at any position of $R_1$ to $R_7$ or at any position of $Y_1$ and $Y_2$ via a linking group, which further comprises a mixed solvent containing a hydroxyl group in the structure thereof and a solvent containing no hydroxyl group.

13. The positive radiation-sensitive composition as claimed in claim 12, wherein the compound (A) is represented by the following formula (IA) or (IB):

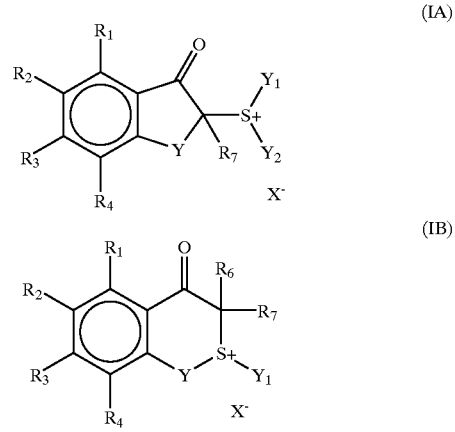

wherein in formula (IA), $R_1$ to $R_4$, $R_7$, $Y_1$, $Y_2$ and $X^-$ have the same meaning as those in formula (I), and Y represents a single bond or a divalent linking group; and in formula (1B), $R_1$ to $R_4$, $R_6$, $R_7$, $Y_1$ and $X^-$ have the same meaning as those in formula (I), and Y represents a single bond or a divalent linking group.

14. The positive radiation-sensitive composition as claimed in claim 12, which further comprises (C) a low molecular weight dissolution-inhibiting compound: having a molecular weight of 3,000 or less; containing an acid-decomposable group; and capable of increasing the solubility in an alkali developing solution by the action of an acid.

15. The positive radiation-sensitive composition as claimed in claim 12, wherein the content of said compound of component (A) is from 0.1 to 20 wt % based on the solid content in the composition.

16. The positive radiation-sensitive composition as claimed in claim 12, which comprises (E) an organic basic compound.

17. The positive radiation-sensitive composition as claimed in claim 16, wherein the organic basic compound is a compound containing the structures represented by formulae (A) to (E):

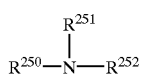
(A)

wherein $R^{250}$, $R^{251}$ and $R^{252}$, which may be the same or different, each represents a hydrogen atom, an alkyl group having from 1 to 20 carbon atoms, an aminoalkyl group having from 1 to 20 carbon atoms, a hydroxyalkyl group having from 1 to 20 carbon atoms, or a substituted or unsubstituted aryl group having from 6 to 20 carbon atoms, and $R^{251}$ and $R^{257}$ may be bonded to each other to form a ring;

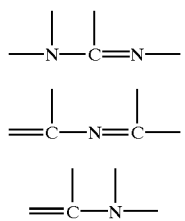
(B)
(C)
(D)

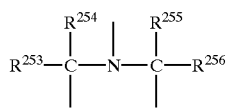
(E)

wherein $R^{253}$, $R^{254}$, $R^{255}$ and $R^{256}$, which may be the same or different, each represents an alkyl group having from 1 to 6 carbon atoms.

18. The positive radiation-sensitive composition as claimed in claim 16, wherein the organic basic compound is a compound containing at least one selected from the group consisting of an onium hydroxide structure, an onium carboxylate structure, a diazabicyclo structure, an imidazol structure, a trialkylamine structure and an aniline structure.

19. The positive radiation-sensitive composition as claimed in claim 12, wherein the mixed solvent is a solvent containing propylene glycol monomethyl ether acetate and propylene glycol monomethyl ether in a ratio of from 90/10 to 50/50.

* * * * *